US009583808B2

(12) United States Patent
Nakajima

(10) Patent No.: US 9,583,808 B2
(45) Date of Patent: Feb. 28, 2017

(54) NONREVERSIBLE CIRCUIT DEVICE

(71) Applicant: Murata Manufacturing Co., Ltd., Kyoto (JP)

(72) Inventor: Reiji Nakajima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/067,916

(22) Filed: Mar. 11, 2016

(65) Prior Publication Data
US 2016/0197390 A1    Jul. 7, 2016

Related U.S. Application Data

(63) Continuation of application No. PCT/JP2014/074168, filed on Sep. 12, 2014.

(30) Foreign Application Priority Data

Sep. 13, 2013 (JP) ................................. 2013-190033
Mar. 12, 2014 (JP) ................................. 2014-049046

(51) Int. Cl.
*H01P 1/38* (2006.01)
*H01P 1/213* (2006.01)
(Continued)

(52) U.S. Cl.
CPC ............... *H01P 1/38* (2013.01); *H01P 1/213* (2013.01); *H03H 7/0115* (2013.01);
(Continued)

(58) Field of Classification Search
CPC ............. H01P 1/38; H01P 1/383; H01P 1/213
(Continued)

(56) References Cited

U.S. PATENT DOCUMENTS 5,973,568 A    10/1999    Shapiro
5,987,308 A *  11/1999    Ookita ................... H01Q 1/243
                                                          330/130
(Continued)

FOREIGN PATENT DOCUMENTS

JP    H03-124103 A    5/1991
JP    H04-345201 A    12/1992
(Continued)

OTHER PUBLICATIONS

International Search Report issued in Application No. PCT/JP2014/074168 dated Dec. 16, 2014.
(Continued)

*Primary Examiner* — Stephen E Jones
(74) *Attorney, Agent, or Firm* — Pearne & Gordon LLP

(57) ABSTRACT

A nonreversible circuit device includes circulators of high pass type, each circulator including a first central conductor, a second central conductor, and a third central conductor arranged on a microwave magnetic body, to which a DC magnetic field is applied, in a relation intersecting each other in a mutually insulated state, and capacitance elements connected respectively in series between one end of the first central conductor and an antenna port, between one end of the second central conductor and a reception port, and between one end of the third central conductor and a transmission port. A pass frequency band of the circulator is lower than that of the circulator. The antenna ports of the circulators are electrically connected to provide one combined antenna port, and a low pass filter is inserted between the combined antenna port and the antenna port of the circulator.

12 Claims, 19 Drawing Sheets

(51) Int. Cl.
*H03H 7/46* (2006.01)
*H03H 7/01* (2006.01)
*H01P 1/36* (2006.01)
*H03H 7/09* (2006.01)

(52) U.S. Cl.
CPC ............... *H03H 7/463* (2013.01); *H01P 1/36* (2013.01); *H03H 7/09* (2013.01)

(58) Field of Classification Search
USPC .................................. 333/1.1, 24.2, 132, 134
See application file for complete search history.

(56) References Cited

U.S. PATENT DOCUMENTS

| 6,215,371 | B1 | 4/2001 | Kurahashi | |
|---|---|---|---|---|
| 2002/0149439 | A1* | 10/2002 | Toncich | G01R 27/2694 333/24.2 |
| 2002/0153963 | A1* | 10/2002 | Kawanami | H01P 1/387 333/24.2 |
| 2011/0204989 | A1 | 8/2011 | Wada | |
| 2013/0321091 | A1* | 12/2013 | Nishida | H01P 1/387 333/1.1 |
| 2015/0372365 | A1* | 12/2015 | Wada | H01P 1/36 333/24.2 |

FOREIGN PATENT DOCUMENTS

| JP | H07-283615 A | 10/1995 |
|---|---|---|
| JP | H11-234003 A | 8/1999 |
| JP | 2002-517930 A | 6/2002 |
| JP | 2011-176668 A | 9/2011 |
| WO | 2011/118278 A1 | 9/2011 |

OTHER PUBLICATIONS

Written Opinion issued in Application No. PCT/JP2014/074168 dated Dec. 16, 2014.

* cited by examiner

M09: 698MHz
　　 -1.43dB
M10: 915MHz
　　 -1.53dB
M11: 1.710GHz
　　 -1.61dB
M12: 1.980GHz
　　 -1.17dB

M25: 729MHz
　　 -1.37dB
M26: 960MHz
　　 -1.75dB
M27: 1.805GHz
　　 -1.46dB
M28: 2.170GHz
　　 -1.33dB

M29: 699MHz
  -1.52dB
M30: 915MHz
  -1.43dB
M31: 1.710GHz
  -2.84dB
M32: 1.980GHz
  -3.11dB
M33: 2.300GHz
  -3.19dB
M34: 2.690GHz
  -2.14dB

M35: 729MHz
  -1.34dB
M36: 960MHz
  -1.67dB
M37: 1.710GHz
  -3.32dB
M38: 2.170GHz
  -3.97dB
M39: 2.300GHz
  -2.94dB
M40: 2.690GHz
  -2.46dB

M13: 699MHz
  -17.76dB
M14: 960MHz
  -24.22dB
M15: 1.710GHz
  -15.77dB
M16: 2.170GHz
  -14.42dB
M41: 2.300GHz
  -14.14dB
M42: 2.690GHz
  -13.80dB

M08: 1.710GHz
  -23.97dB
M04: 2.170GHz
  -33.79dB
M50: 2.300GHz
  -31.66dB
M51: 2.690GHz
  -37.52dB

M52: 699MHz
 −36.45dB
M53: 960MHz
 −33.14dB
M54: 2.300GHz
 −33.96dB
M55: 2.690GHz
 −29.81dB

M01: 699MHz
 −70.45dB
M02: 960MHz
 −71.53dB
M17: 1.710GHz
 −28.16dB
M18: 2.170GHz
 −24.24dB

NONREVERSIBLE CIRCUIT DEVICE

BACKGROUND

Technical Field

The present disclosure relates to a nonreversible circuit device, and more particularly to a nonreversible circuit device such as a circulator used in microwave bands.

A nonreversible circuit device, e.g., an isolator or a circulator, usually has characteristics allowing a signal to be transferred only in a predetermined particular direction, but not allowing a signal to be transferred in a direction opposite to the particular direction. By utilizing those characteristics, the nonreversible circuit device is used in a transmission circuit section and a reception circuit section of a mobile communication device, e.g., a cellular phone.

Meanwhile, with recent technical development, one cellular phone is usable in communications over a plurality of frequency bands. To be adapted for such a situation, Patent Document 1 proposes a power amplification module for a dual mode digital system in which output portions of two transmission systems are connected to an antenna through a diplexer.

In the proposed module, however, a tuner for impedance matching is required, in addition to the diplexer, between the diplexer and the antenna to be adapted for the plurality of frequency bands. Hence the number of components and the cost are increased. Another problem is that load variations (impedance variations) at the antenna side directly affect a transmission circuit.

Patent Document 1: Japanese Unexamined Patent Application Publication (Translation of PCT Application) No. 2002-517930

BRIEF SUMMARY

The present disclosure provides a nonreversible circuit device capable of operating in a plurality of frequency bands, reducing the number of components and the cost of a transmission-reception circuit, suppressing influences of load variations at the antenna side upon the transmission-reception circuit, and stabilizing the operation of the transmission-reception circuit.

A nonreversible circuit device according to a first aspect of the present disclosure includes first and second circulators of high pass type, each circulator including a first central conductor, a second central conductor, and a third central conductor arranged on a microwave magnetic body, to which a DC magnetic field is applied from a permanent magnet, in a relation intersecting each other in a mutually insulated state, and capacitance elements connected respectively in series between one end of the first central conductor and an antenna port, between one end of the second central conductor and a reception port, and between one end of the third central conductor and a transmission port, wherein a pass frequency band of the first circulator is lower than a pass frequency band of the second circulator, the respective antenna ports of the first and second circulators are electrically connected to provide one combined antenna port, and a low pass filter is inserted between the combined antenna port and the antenna port of the first circulator.

A nonreversible circuit device according to a second aspect of the present disclosure includes first and second circulators of high pass type, each circulator including a first central conductor, a second central conductor, and a third central conductor arranged on a microwave magnetic body, to which a DC magnetic field is applied from a permanent magnet, in a relation intersecting each other in a mutually insulated state, and capacitance elements connected respectively in series between one end of the first central conductor and an antenna port, between one end of the second central conductor and a reception port, and between one end of the third central conductor and a transmission port, wherein a pass frequency band of the first circulator is lower than a pass frequency band of the second circulator, the respective antenna ports of the first and second circulators are electrically connected to provide one combined antenna port, and a low pass filter is inserted between the combined antenna port and the antenna port of the first circulator, and a high pass filter is inserted between the combined antenna port and the antenna port of the second circulator.

A nonreversible circuit device according to a third aspect of the present disclosure includes first, second and third circulators of high pass type, each circulator including a first central conductor, a second central conductor, and a third central conductor arranged on a microwave magnetic body, to which a DC magnetic field is applied from a permanent magnet, in a relation intersecting each other in a mutually insulated state, and capacitance elements connected respectively in series between one end of the first central conductor and an antenna port, between one end of the second central conductor and a reception port, and between one end of the third central conductor and a transmission port, wherein a pass frequency band of the first circulator is lower than a pass frequency band of the second circulator, and the pass frequency band of the second circulator is lower than a pass frequency band of the third circulator, the respective antenna ports of the first, second and third circulators are electrically connected to provide one combined antenna port, and a low pass filter is inserted between the combined antenna port and the antenna port of the first circulator, a band pass filter or a low pass filter is inserted between the combined antenna port and the antenna port of the second circulator, and a high pass filter is inserted between the combined antenna port and the antenna port of the third circulator.

A nonreversible circuit device according to a fourth aspect of the present disclosure includes first to N-th (N is an integer equal to or more than 2) circulators of high pass type, each circulator including a first central conductor, a second central conductor, and a third central conductor arranged on a microwave magnetic body, to which a DC magnetic field is applied from a permanent magnet, in a relation intersecting each other in a mutually insulated state, and capacitance elements connected respectively in series between one end of the first central conductor and an antenna port, between one end of the second central conductor and a reception port, and between one end of the third central conductor and a transmission port, wherein a pass frequency band of the (N−1)-th circulator is lower than a pass frequency band of the N-th circulator, the respective antenna ports of the first to N-th circulators are electrically connected to provide one combined antenna port, and a low pass filter is inserted between the combined antenna port and the antenna port of the first circulator, a band pass filter or a low pass filter is inserted between the combined antenna port and the antenna port of each of the second to (N−1)-th circulators, and a high pass filter is inserted between the combined antenna port and the antenna port of the N-th circulator.

Each of the circulators of high pass type in the above-described nonreversible circuit devices outputs a high-frequency signal, which is input from the antenna port, to the reception port, and outputs a high-frequency signal, which is input from the transmission port, to the antenna port.

The respective antenna ports of the individual circulators are electrically connected to provide one combined antenna port, and the individual circulator are integrated into one nonreversible circuit device in the form of a module. Furthermore, the low pass filter is inserted between the combined antenna port ANT and the first circulator. Accordingly, a harmonic band generated in the first circulator having the lower pass frequency band is attenuated, and interference with the second circulator having the higher pass frequency band is prevented.

In other words, the nonreversible circuit device is substitutable for a diplexer in a transmission-reception circuit, and a tuner for impedance matching is no longer required to be disposed at the antenna side. Moreover, the nonreversible circuit device can suppress influences of load variations (impedance variations) at the antenna side by the isolation action, and can stabilize the operation of an amplifier at the transmission side.

According to the present disclosure, it is possible to perform operations in a plurality of frequency bands, to reduce the number of components and the cost of the transmission-reception circuit, to suppress influences of load variations at the antenna side upon the transmission-reception circuit, and to stabilize the operation of the transmission-reception circuit.

DETAILED DESCRIPTION

Figure 1:
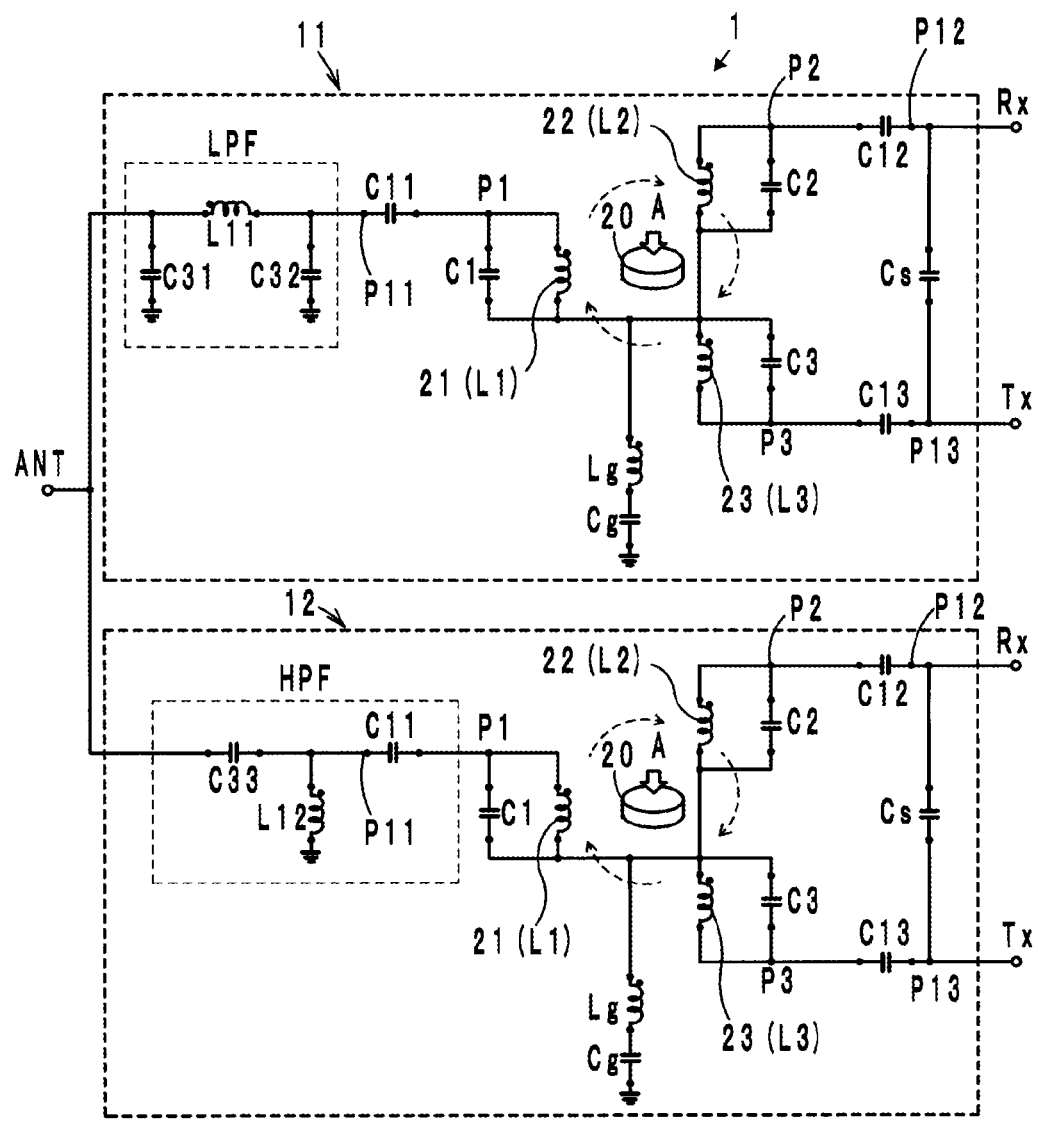
FIG. 1 is an equivalent circuit diagram of a nonreversible circuit device according to a first embodiment.

Embodiments of the nonreversible circuit device according to the present disclosure will be described below with reference to the accompanying drawings. It is to be noted that the same members in the drawings are denoted by common reference signs, and duplicate description of those members is omitted.

First Embodiment

See FIGS. 1 to 7

Figure 2:
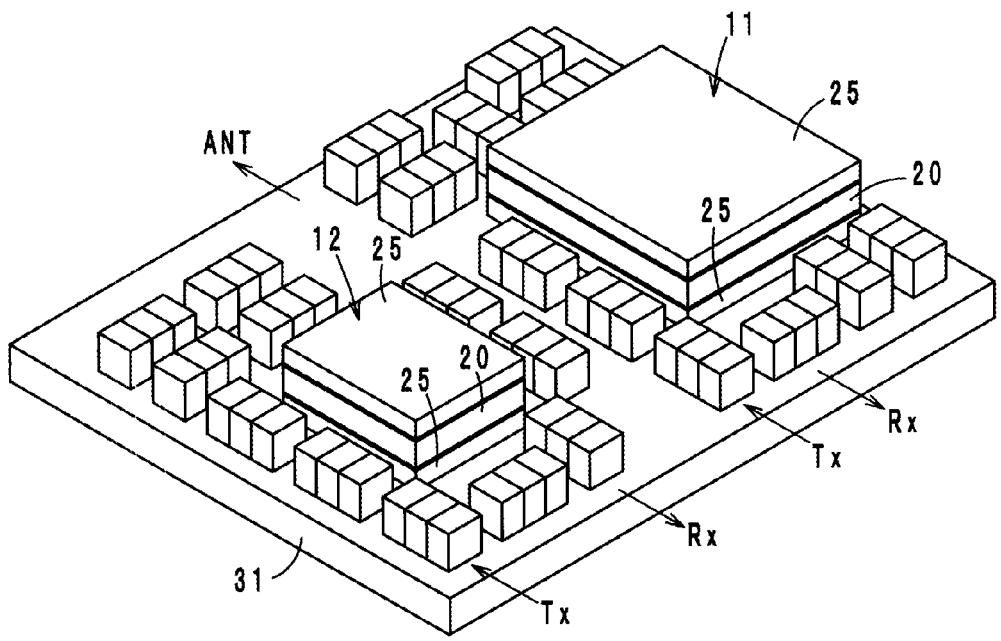
FIG. 2 is a perspective view of a first module of the nonreversible circuit device.
Figure 3:
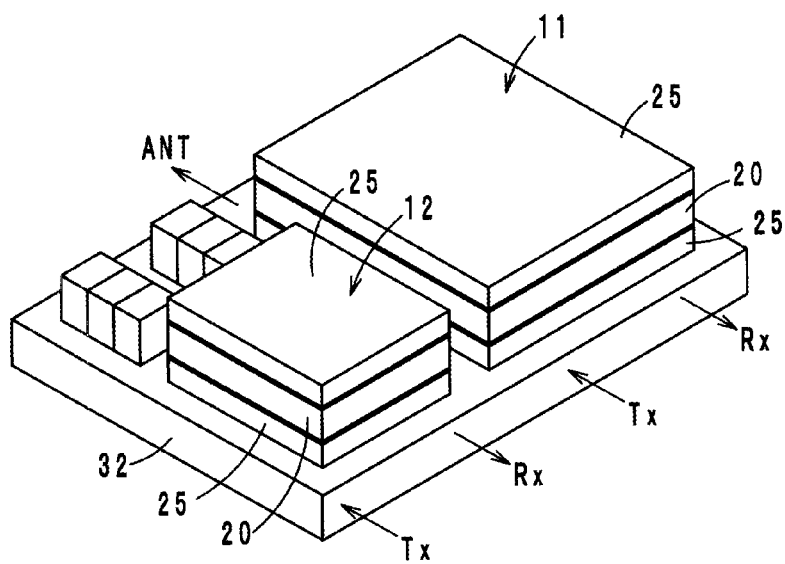
FIG. 3 is a perspective view of a second module of the nonreversible circuit device.

In a nonreversible circuit device 1 according to a first embodiment, illustrated in an equivalent circuit diagram of FIG. 1, a 3-port first circulator 11 and a 3-port second circulator 12 are constituted in the form of an integral module (see FIGS. 2 and 3). The first and second circulators 11 and 12 are each a lumped circulator in which a first central conductor 21 constituting an inductor L1, a second central conductor 22 constituting an inductor L2, and a third central conductor 23 constituting an inductor L3 are arranged on a microwave magnetic body (ferrite 20) in a relation intersecting each other at a predetermined angle in a mutually insulated state. Capacitance elements C1, C2 and C3 are connected in parallel to the first, second and third central conductors 21, 22 and 23, respectively.

A capacitance element C11 is connected between one terminal P1 of the first central conductor 21 and an antenna port P11 (ANT), a capacitance element C12 is connected between one terminal P2 of the second central conductor 22 and a reception port P12 (Rx), and a capacitance element C13 is connected between one terminal P3 of the third central conductor 23 and a transmission port P13 (Tx).

Respective other ends of the central conductors 21, 22 and 23 are connected to one another and further connected to a ground through an inductance element Lg and a capacitance element Cg, which are connected in series. In addition, a capacitance element Cs is connected between the reception port P12 (Rx) and the transmission port P13 (Tx).

The circulators 11 and 12 are each of high pass type, and a pass frequency band of the first circulator 11 is set to be lower than that of the second circulator 12. For example, the pass frequency band of the first circulator 11 is set to a 800-MHz band (699 to 960 MHz), and the pass frequency band of the second circulator 12 is set to a 2-GHz band (1710 to 2170 MHz).

The respective antenna ports P11 of the first and second circulators 11 and 12 are electrically connected to provide one combined antenna port ANT. Furthermore, a low pass filter LPF is inserted between the combined antenna port ANT and the antenna port P11 of the first circulator 11, and a high pass filter HPF is inserted between the combined antenna port ANT and the antenna port P11 of the second circulator 12. The low pass filter LPF is constituted as a π-type resonance circuit made up of an inductance element L11 and capacitance elements C31 and C32. The high pass filter HPF is constituted as a T-type resonance circuit made up of an inductance element L12, a capacitance element C33, and the above-mentioned capacitance element C11.

Figure 22:
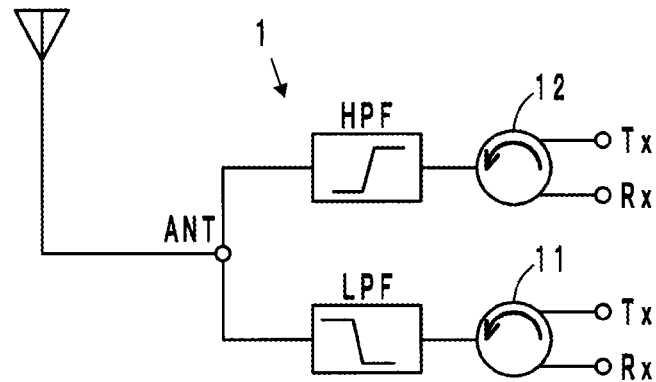
FIG. 22A is a schematic circuit diagram of the first embodiment.
FIG. 22B is a schematic circuit diagram of the second embodiment.
FIG. 22C is a schematic circuit diagram of the third embodiment.
Figure 22:
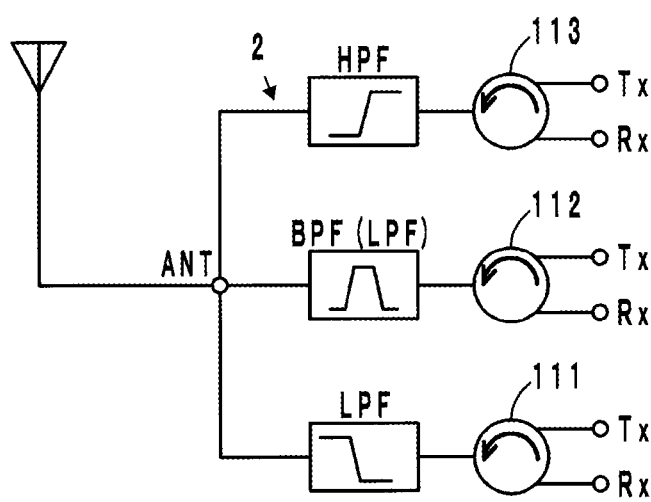
Figure 22:
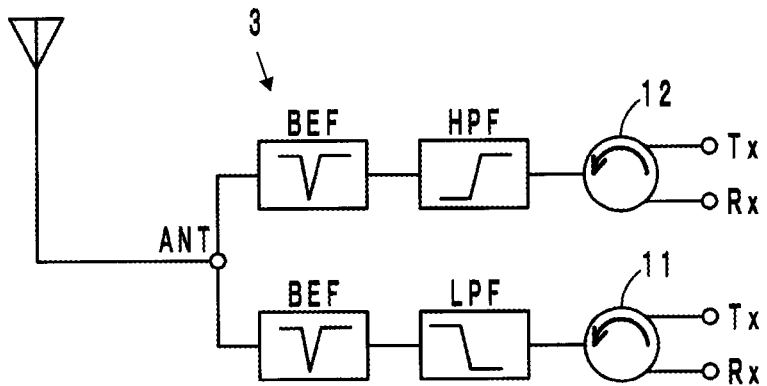

A schematic circuit configuration of the thus-constituted nonreversible circuit device 1 according to the first embodiment is as per illustrated in FIG. 22A.

FIG. 2 illustrates a first example of the nonreversible circuit device 1 constituted into the form of a module. On a printed wiring board 31, the first and second circulators 11 and 12 are arranged side by side. In each of the first and second circulators 11 and 12, the ferrite 20 is sandwiched at its upper and lower surfaces by permanent magnets 25 for applying a DC magnetic field (see an arrow A in FIG. 1) to the ferrite 20. Furthermore, individual chip-type elements are arranged around both the circulators.

FIG. 3 illustrates a second example of the nonreversible circuit device 1 constituted into the form of a module. In the second example, an LTCC substrate 32 is used, and individual elements are constituted by electrodes (not illustrated) formed inside the LTCC substrate 32.

The nonreversible circuit device 1 is assembled into a transmission-reception circuit of a cellular phone. In each of the circulators 11 and 12, a high-frequency signal input from the antenna port P11 is output to the reception port P12 (Rx) through magnetic coupling between the first and second central conductors 21 and 22, while a high-frequency signal input from the transmission port P13 (Tx) is output to the antenna port P11 through magnetic coupling between the second and third central conductors 22 and 23. It is to be noted that, when a direction of the magnetic field applied to the ferrite 20 is reversed, a transfer path of the high-frequency signal is exchanged.

Figure 4:
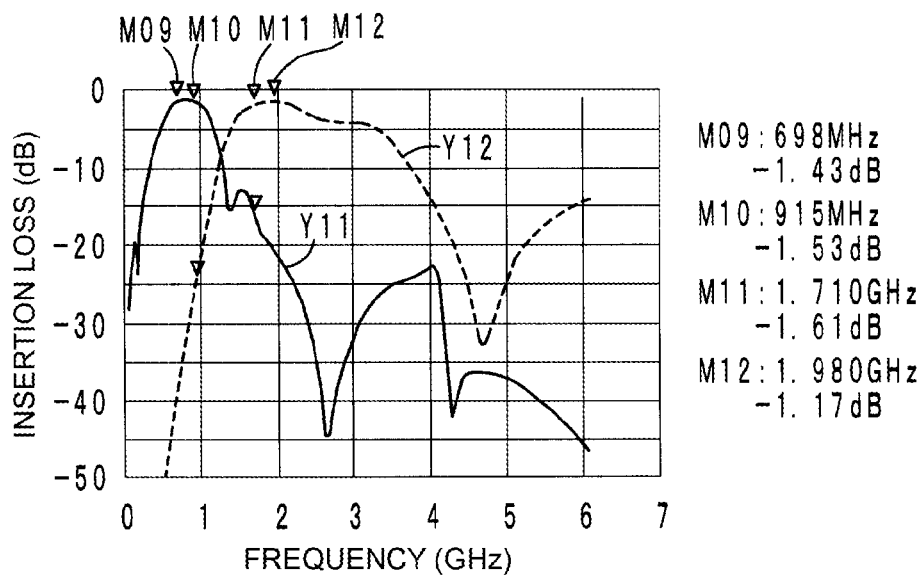
FIG. 4 is a graph depicting insertion loss characteristics of the nonreversible circuit device in a direction from an antenna port toward a reception port.

The circulators 11 and 12 are set to have characteristics, illustrated in FIGS. 4 to 7, such that transmission and reception in respective pass frequency bands are switchable. FIG. 4 depicts insertion loss characteristics in a direction from the antenna port P11 toward the reception port P12 (Rx). A curve Y11 represents the insertion loss characteristics of the first circulator 11, and a curve Y12 represents the insertion loss characteristics of the second circulator 12. An insertion loss in the first circulator 11 is −1.43 dB at 698 MHz and −1.53 dB at 915 MHz. An insertion loss in the second circulator 12 is −1.61 dB at 1.710 GHz, and −1.17 dB at 1.980 GHz.

Figure 5:
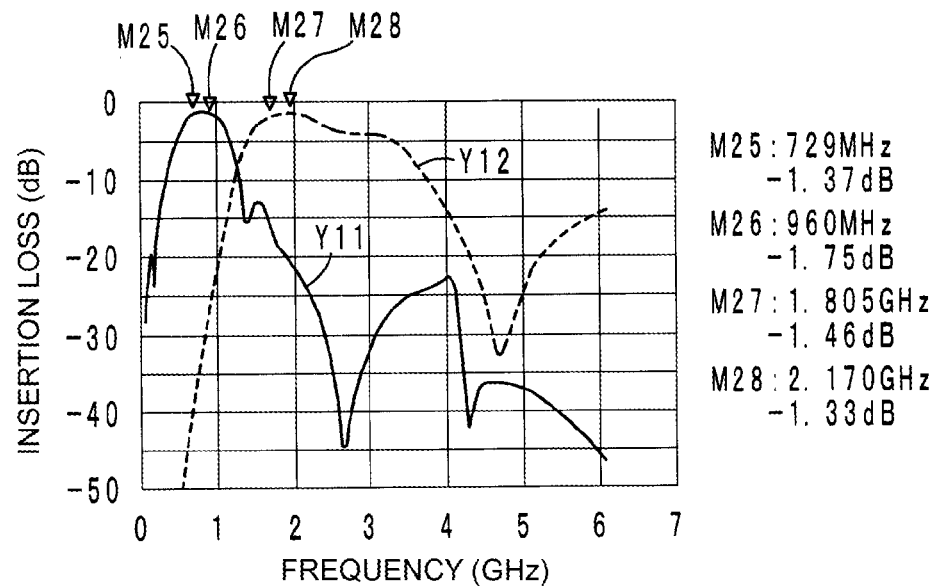
FIG. 5 is a graph depicting insertion loss characteristics of the nonreversible circuit device in a direction from a transmission port toward the antenna port.

FIG. 5 depicts insertion loss characteristics in a direction from the transmission port P13 (Tx) toward the antenna port P11. A curve Y11 represents the insertion loss characteristics of the first circulator 11, and a curve Y12 represents the insertion loss characteristics of the second circulator 12. An insertion loss in the first circulator 11 is −1.37 dB at 729 MHz and −1.75 dB at 960 MHz. An insertion loss in the second circulator 12 is −1.46 dB at 1.805 GHz and −1.33 dB at 2.170 GHz.

Figure 6:
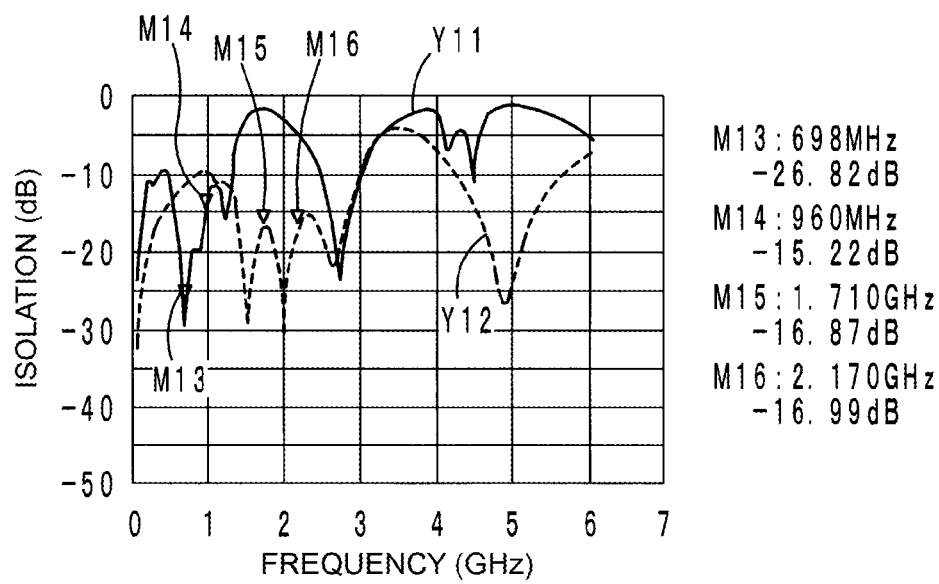
FIG. 6 is a graph depicting isolation characteristics of the nonreversible circuit device in a direction from the transmission port toward the reception port.

FIG. 6 depicts isolation characteristics in a direction from the transmission port P13 (Tx) toward the reception port P12 (Rx). A curve Y11 represents the isolation characteristics of the first circulator 11, and a curve Y12 represents the isolation characteristics of the second circulator 12. An isolation degree in the first circulator 11 is −26.82 dB at 698 MHz and −15.22 dB at 960 MHz. An isolation degree in the second circulator 12 is −16.87 dB at 1.710 GHz and −16.99 dB at 2.170 GHz.

Figure 7:
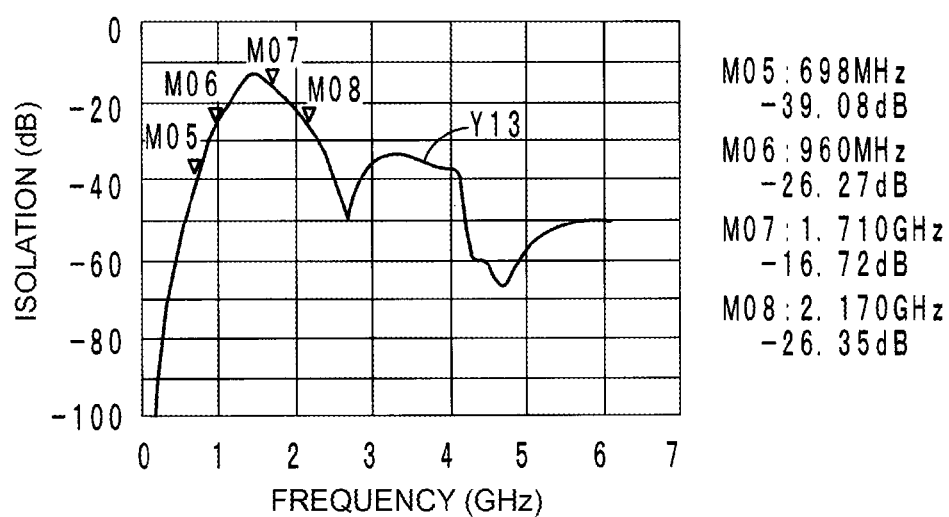
FIG. 7 is a graph depicting isolation characteristics of the nonreversible circuit device in a direction from a transmission port of a first circulator toward a reception port of a second circulator.

FIG. 7 depicts isolation characteristics in a direction from the transmission port P13 (Tx) of the first circulator 11 toward the reception port P12 (Rx) of the second circulator 12. As seen from a curve Y13, an isolation degree is −39.08 dB at 698 MHz and −26.27 dB at 960 MHz. Furthermore, the isolation degree is −16.72 dB at 1.710 GHz and −26.35 dB at 2.170 GHz.

The insertion loss characteristics illustrated in FIGS. 4 and 5 represent properties allowing the high-frequency signal to pass with a loss as small as possible, and the isolation characteristics illustrated in FIG. 6 represent properties attenuating the high-frequency signal to an extent as large as possible. The losses in the directions from Tx toward ANT and from ANT toward Rx are about 1.5 dB, and the attenuation in the direction from Tx toward Rx is about 15 dB. Therefore, the nonreversible circuit device 1 has the switching function. Moreover, the isolation characteristics illustrated in FIG. 7 represent that, in each of the circulators 11 and 12, the pass frequency band of the other circulator 12 or 11 is sufficiently attenuated for the purpose of combining the different frequency bands. The attenuation in the frequency band for the counterpart circulator is about 15 dB or more. Accordingly, the nonreversible circuit device 1 has the function of a demultiplexer.

In the first embodiment, as described above, the respective output portions of the circulators 11 and 12 are electrically connected to provide the one combined antenna port ANT such that both the circulators function as one nonreversible circuit device 1. Furthermore, since the low pass filter LPF is inserted between the combined antenna port ANT and the antenna port P11 (ANT) of the first circulator 11, a harmonic band generated in the first circulator 11 having the lower pass frequency band is attenuated, and interference with the second circulator 12 having the higher pass frequency band is prevented. Moreover, the circulators 11 and 12 are able to suppress, by the isolation action, influences of load variations (impedance variations) at the side including the antenna port ANT upon the transmission-reception circuit, and to stabilize the operation of the transmission-reception circuit.

(Modification of First Embodiment)

In the above-described nonreversible circuit device 1 according to the first embodiment, the inductance element Lg and the capacitance element Cg, which are connected in series, and the capacitance element Cs are inserted with intent to widen the frequency band. However, those elements are not always required, and they may be omitted. The high pass filter HPF inserted in the second circulator 12 is also not always required, and it may be omitted. Those points are similarly applied to an eighth embodiment described later.

Second Embodiment

Figure 8:
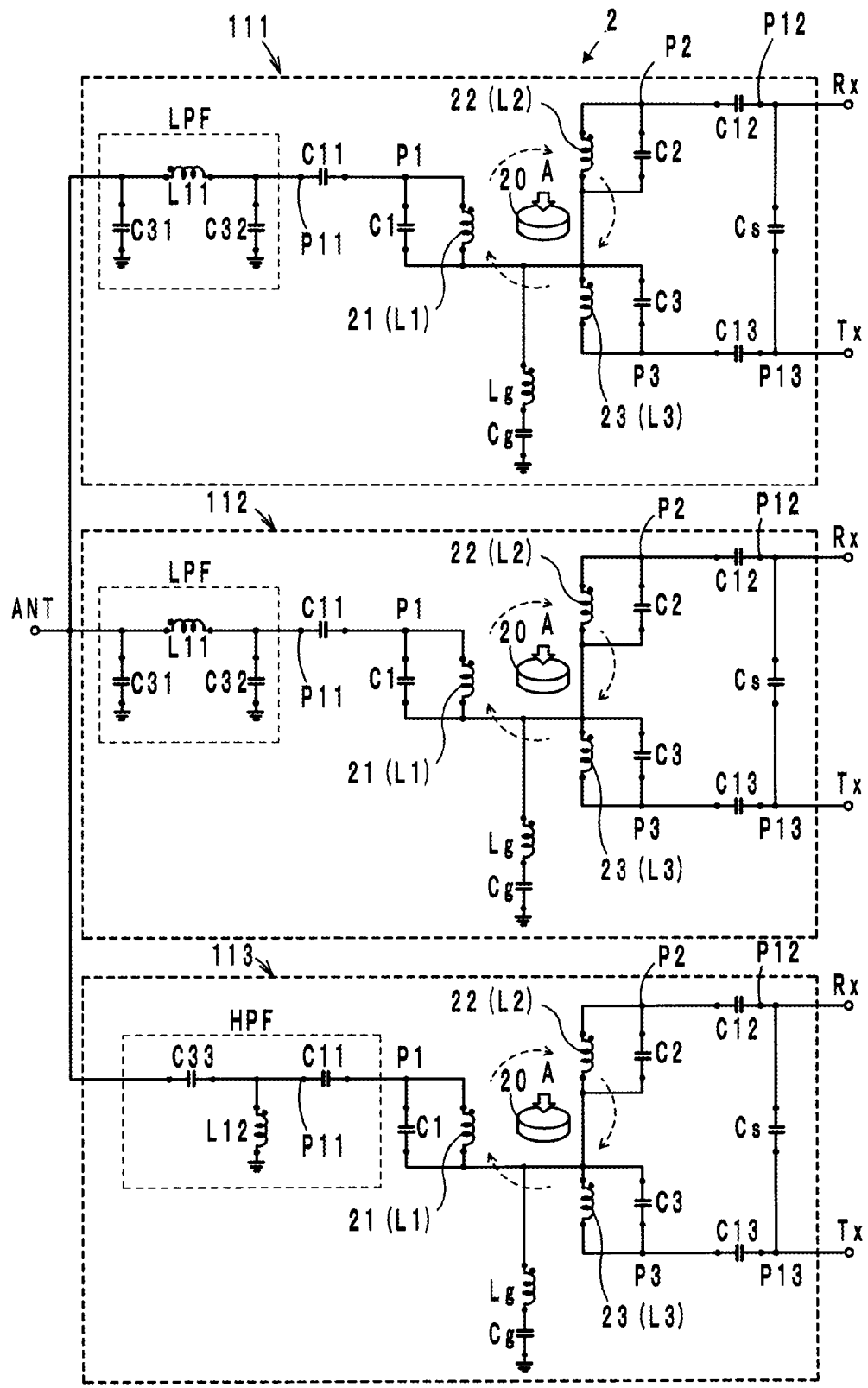
FIG. 8 is an equivalent circuit diagram of a nonreversible circuit device according to a second embodiment.
Figure 9:
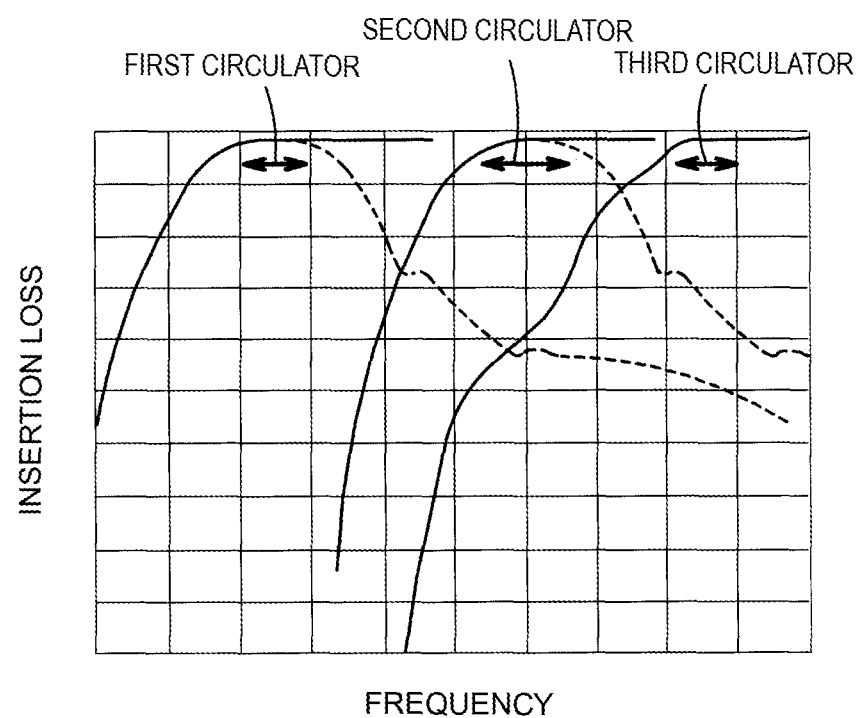
FIG. 9 is a graph depicting insertion loss characteristics of individual circulators in the nonreversible circuit device according to the second embodiment.

See FIGS. 8 to 9

In a nonreversible circuit device 2 according to a second embodiment, as illustrated in an equivalent circuit diagram of FIG. 8, a first circulator 111, a second circulator 112, and a third circulator 113, each being of the 3-port type, are constituted in the form of an integral module. The first circulator 111 corresponds to the first circulator 11 in the first embodiment, and the third circulator 113 corresponds to the second circulator 12 in the first embodiment. In other words, in this second embodiment, the second circulator 112 is added to the first embodiment.

A pass frequency band of the first circulator 111 is lower than that of the second circulator 112, and the pass frequency band of the second circulator 112 is lower than that of the third circulator 113. Respective antenna ports P11 (ANT) of the first, second and third circulators 111, 112 and 113 are electrically connected to provide one combined antenna port ANT.

Furthermore, a low pass filter LPF is inserted between the combined antenna port ANT and the antenna port P11 (ANT) of the first circulator 111, and a low pass filter LPF (which may be a band pass filter) is inserted between the combined antenna port P11 (ANT) and the antenna port P11 (ANT) of the second circulator 112. A high pass filter HPF is inserted between the combined antenna port ANT and the antenna port P11 (ANT) of the third circulator 113.

A schematic circuit configuration of the thus-constituted nonreversible circuit device 2 according to the second embodiment is as per illustrated in FIG. 22B.

Respective insertion loss characteristics of the circulators 111, 112 and 113 in the nonreversible circuit device 2 are as per depicted in FIG. 9 such that transmission and reception can be performed in a manner of switching over three frequency bands.

(Modification of Second Embodiment)

As seen from the second embodiment, the nonreversible circuit device may include a number N of circulators of high pass type. In that case, a pass frequency band of the (N−1)-th circulator is lower than that of the N-th circulator 12, and respective antenna ports of the first to N-th circulators are electrically connected to provide one combined antenna port. Furthermore, a low pass filter is inserted between the combined antenna port and the antenna port of the first circulator, a band pass filter or a low pass filter is inserted between the combined antenna port and the antenna port of each of the second to the (N−1)-th circulator, and a high pass filter is inserted between the combined antenna port and the antenna port of the N-th circulator.

Third Embodiment

Figure 10:
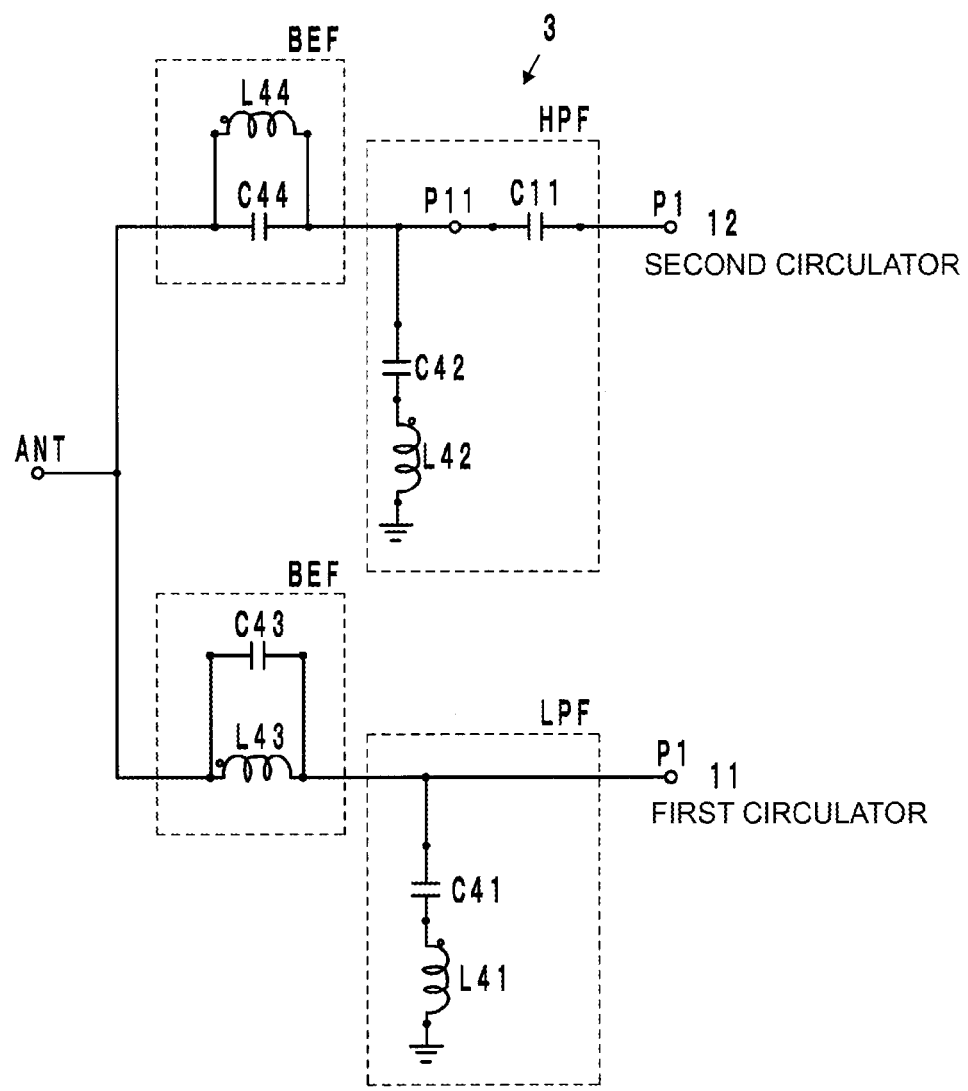
FIG. 10 is an equivalent circuit diagram of a principal part of a nonreversible circuit device according to a third embodiment.

See FIG. 10

A nonreversible circuit device 3 according to a third embodiment is different from the nonreversible circuit device 1 according to the first embodiment, as illustrated in FIG. 10, in that a band elimination filter BEF is connected between the low pass filter LPF disposed in the first circulator 11 and the combined antenna port ANT, and that a band elimination filter BEF is connected between the high pass filter HPF disposed in the second circulator 12 and the combined antenna port ANT. In this third embodiment, the other configuration is similar to that in the first embodiment, and advantageous effects are also basically similar to those in the first embodiment.

In more detail, the low pass filter LPF disposed in the first circulator 11 is constituted as a series resonance circuit made up of a capacitance element C41 and an inductance element L41. The high pass filter HPF disposed in the second circulator 12 is constituted by a series resonance circuit, which is made up of a capacitance element C42 and an inductance element L42, and a capacitance element C11 for matching. The band elimination filter BEF disposed in the first circulator 11 is constituted as a parallel resonance circuit made up of a capacitance element C43 and an inductance element L43. The band elimination filter BEF disposed in the second circulator 12 is constituted as a parallel resonance circuit made up of a capacitance element C44 and an inductance element L44.

A schematic circuit configuration of the thus-constituted nonreversible circuit device 3 according to the third embodiment is as per illustrated in FIG. 22C.

Fourth Embodiment

Figure 11:
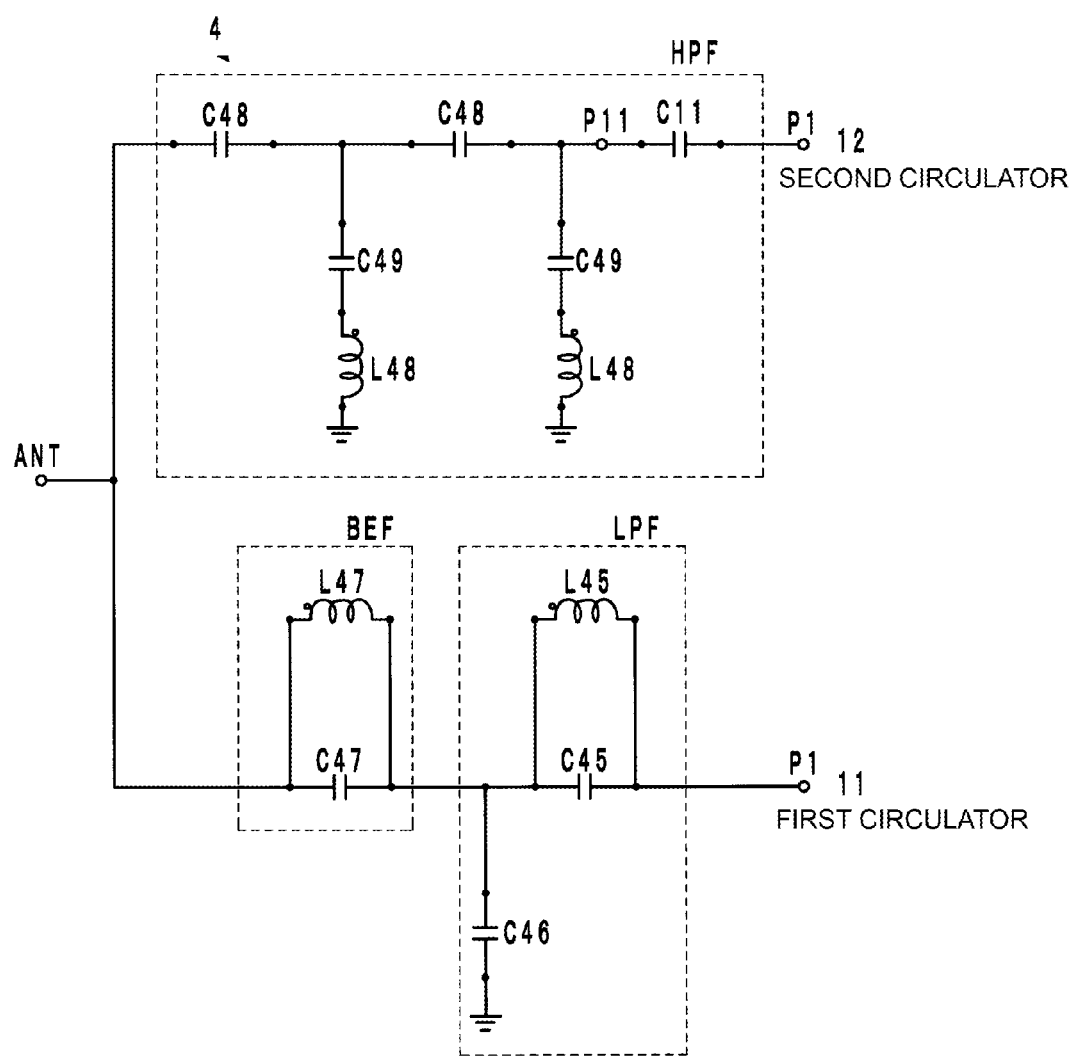
FIG. 11 is an equivalent circuit diagram of a principal part of a nonreversible circuit device according to a fourth embodiment.

See FIG. 11

A nonreversible circuit device 4 according to a fourth embodiment is different from the nonreversible circuit device 1 according to the first embodiment, as illustrated in FIG. 11, in that a band elimination filter BEF is connected between the low pass filter LPF disposed in the first circulator 11 and the combined antenna port ANT. In this fourth embodiment, the other configuration is similar to that in the first embodiment, and advantageous effects are also basically similar to those in the first embodiment.

In more detail, the low pass filter LPF disposed in the first circulator 11 is constituted by a parallel resonance circuit made up of a capacitance element C45 and an inductance element L45, which are connected in parallel, and by a capacitance element C46 connected to the ground. The band elimination filter BEF is constituted as a parallel resonance circuit made up of a capacitance element C47 and an inductance element L47. The high pass filter HPF in the second circulator 12 is constituted by connecting a capacitance element C11 for matching, and two stages of a capacitance element C48 and a resonance circuit that is made up of a capacitance element C49 and an inductance element L48.

Figure 23:
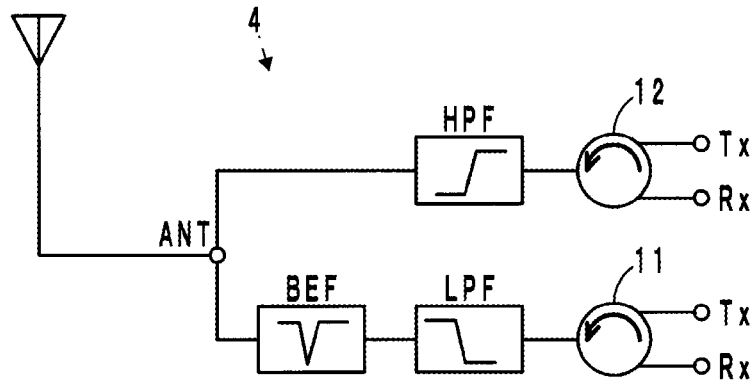
FIG. 23A is a schematic circuit diagram of the fourth embodiment.
FIG. 23B is a schematic circuit diagram of the fifth embodiment.
FIG. 23C is a schematic circuit diagram of the sixth embodiment.
Figure 23:
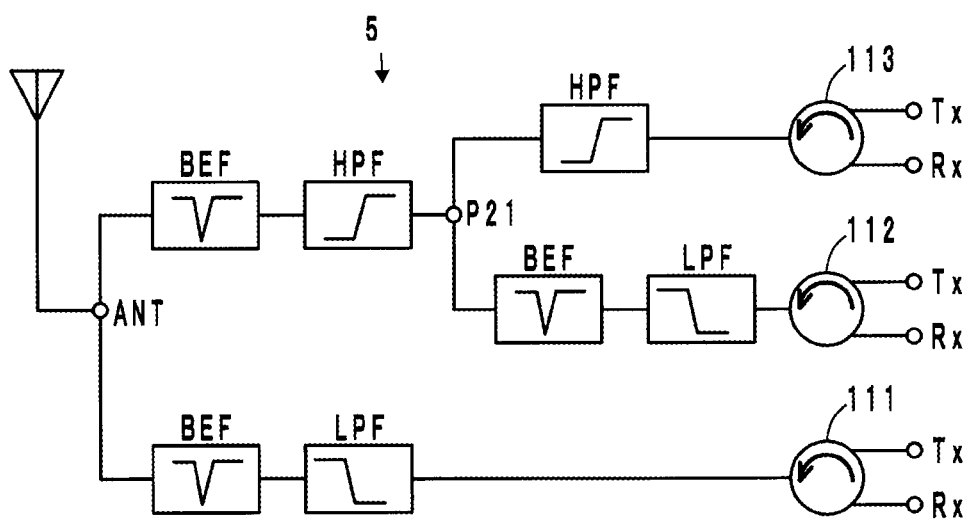
Figure 23:
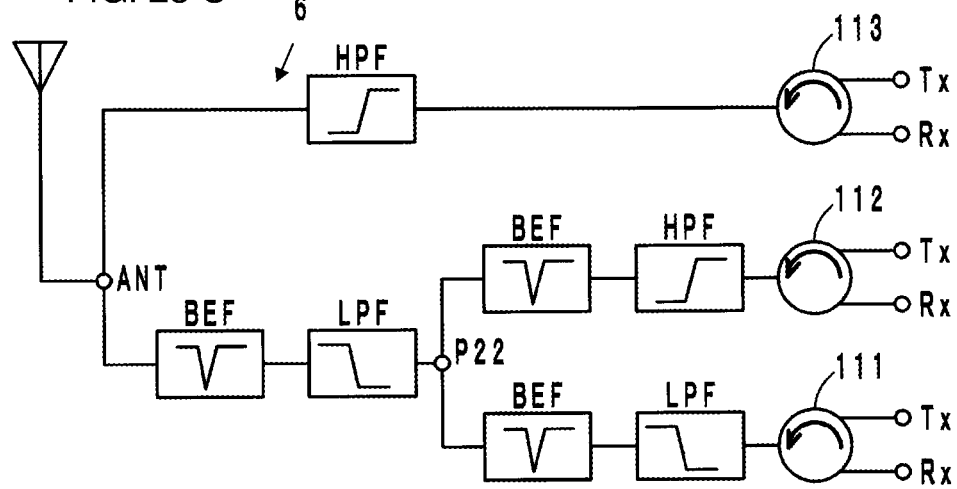

A schematic circuit configuration of the thus-constituted nonreversible circuit device 4 according to the fourth embodiment is as per illustrated in FIG. 23A.

Fifth Embodiment

See FIGS. 12 to 18

Figure 12:
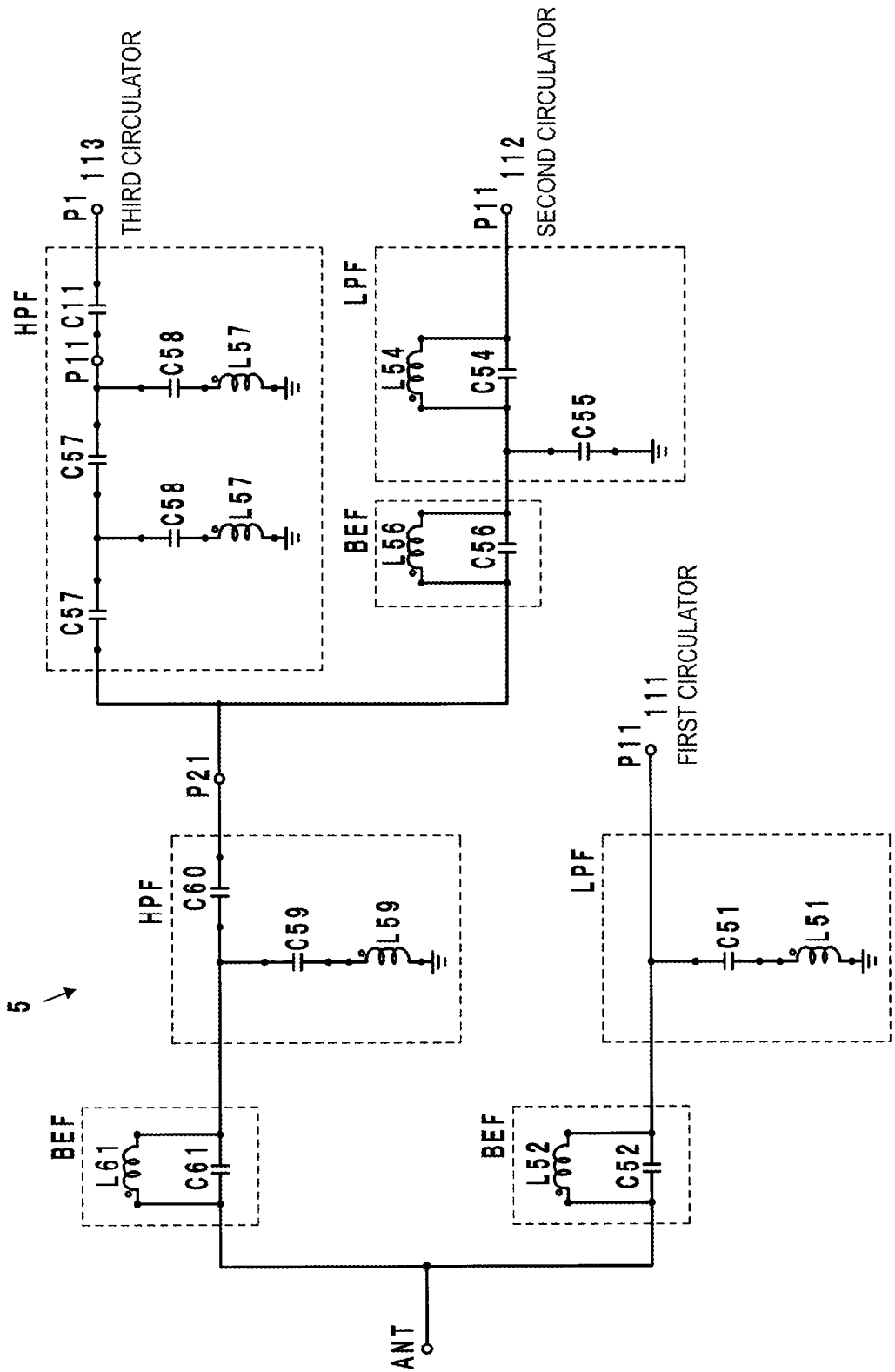
FIG. 12 is an equivalent circuit diagram of a principal part of a nonreversible circuit device according to a fifth embodiment.

A nonreversible circuit device 5 according to a fifth embodiment is different from the nonreversible circuit device 2 according to the second embodiment as follow. Specifically, as illustrated in FIG. 12, a band elimination filter BEF is connected between the low pass filter LPF disposed in the first circulator 111 and the combined antenna port ANT. Another band elimination filter BEF is connected to the low pass filter LPF disposed in the second circulator 112. Between a port P21, which is a junction point between the above band elimination filter BEF in the second circulator 112 and the high pass filter HPF in the third circulator 113, and the combined antenna port ANT, another high pass filter HPF and still another band elimination filter BEF are connected. In this fifth embodiment, the other configuration is similar to that in the second embodiment, and advantageous effects are also basically similar to those in the second embodiment.

In more detail, the low pass filter LPF disposed in the first circulator 111 is constituted as a series resonance circuit made up of a capacitance element C51 and an inductance element L51. The band elimination filter BEF disposed in the first circulator 111 is constituted as a resonance circuit made up of an inductance element L52 and a capacitance element C52, which are connected in parallel. The low pass filter LPF disposed in the second circulator 112 is constituted by a resonance circuit made up of a capacitance element C54 and an inductance element L54, which are connected in parallel, and by a capacitance element C55 connected to the ground. The band elimination filter BEF disposed in the second circulator 112 is constituted as a resonance circuit made up of an inductance element L56 and a capacitance element C56, which are connected in parallel. The high pass filter HPF disposed in the third circulator 113 is constituted by connecting a capacitance element C11 for matching, and two stages of a capacitance element C57 and a series resonance circuit that is made up of a capacitance element C58 and an inductance element L57. The high pass filter HPF disposed in common to the second and third circulators 112 and 113 is constituted by a series resonance circuit, which is made up of a capacitance element C59 and an inductance element L59, and by a capacitance element C60. The band elimination filter BEF disposed in common to the second and third circulators 112 and 113 is constituted as a parallel resonance circuit made up of a capacitance element C61 and an inductance element L61.

A schematic circuit configuration of the thus-constituted nonreversible circuit device 5 according to the fifth embodiment is as per illustrated in FIG. 23B.

Figure 13:
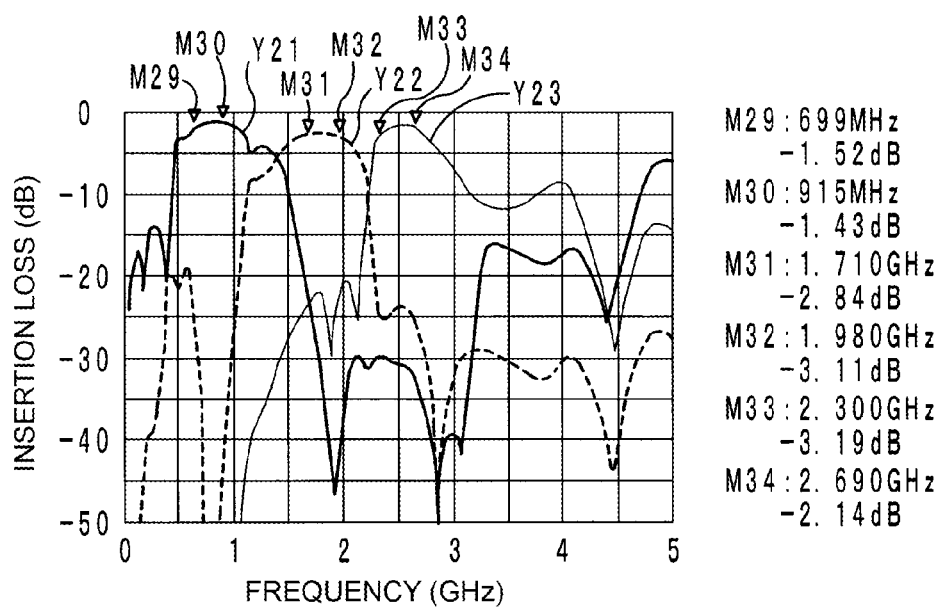
FIG. 13 is a graph depicting insertion loss characteristics of the nonreversible circuit device according to the fifth embodiment in a direction from a transmission port toward an antenna port.

The circulators 111, 112 and 113 are set to have characteristics, illustrated in FIGS. 13 to 18, such that transmission and reception in respective pass frequency bands are switchable. FIG. 13 depicts insertion loss characteristics in a direction from a transmission port Tx toward an antenna port ANT. A curve Y21 represents the insertion loss characteristics of the first circulator 111, a curve Y22 represents the insertion loss characteristics of the second circulator 112, and a curve Y23 represents the insertion loss characteristics of the third circulator 113. An insertion loss in the first circulator 111 is −1.52 dB at 699 MHz and −1.43 dB at 915 MHz. An insertion loss in the second circulator 112 is −2.84 dB at 1.710 GHz and −3.11 dB at 1.980 GHz. An insertion loss in the third circulator 113 is −3.19 dB at 2.300 GHz and −2.14 dB at 2.690 GHz.

Figure 14:
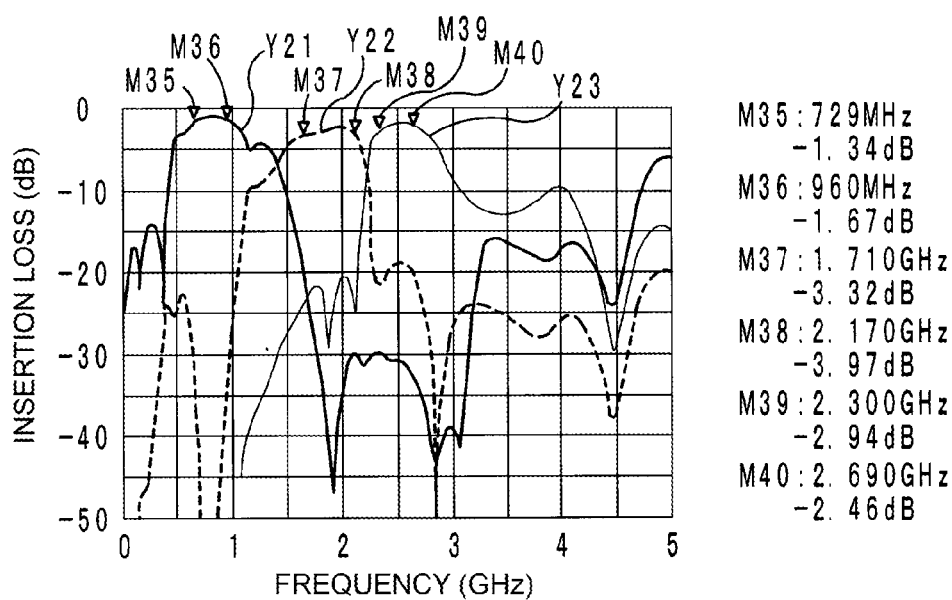
FIG. 14 is a graph depicting insertion loss characteristics of the nonreversible circuit device according to the fifth embodiment in a direction from the antenna port toward a reception port.

FIG. 14 depicts insertion loss characteristics in a direction from the antenna port ANT toward a reception port Rx. A curve Y21 represents the insertion loss characteristics of the first circulator 111, a curve Y22 represents the insertion loss characteristics of the second circulator 112, and a curve Y23 represents the insertion loss characteristics of the third circulator 113. An insertion loss in the first circulator 111 is −1.34 dB at 729 MHz and −1.67 dB at 960 MHz. An insertion loss in the second circulator 112 is −3.32 dB at 1.710 GHz and −3.97 dB at 2.170 GHz. An insertion loss in the third circulator 113 is −2.94 dB at 2.300 GHz and −2.46 dB at 2.690 GHz.

Figure 15:
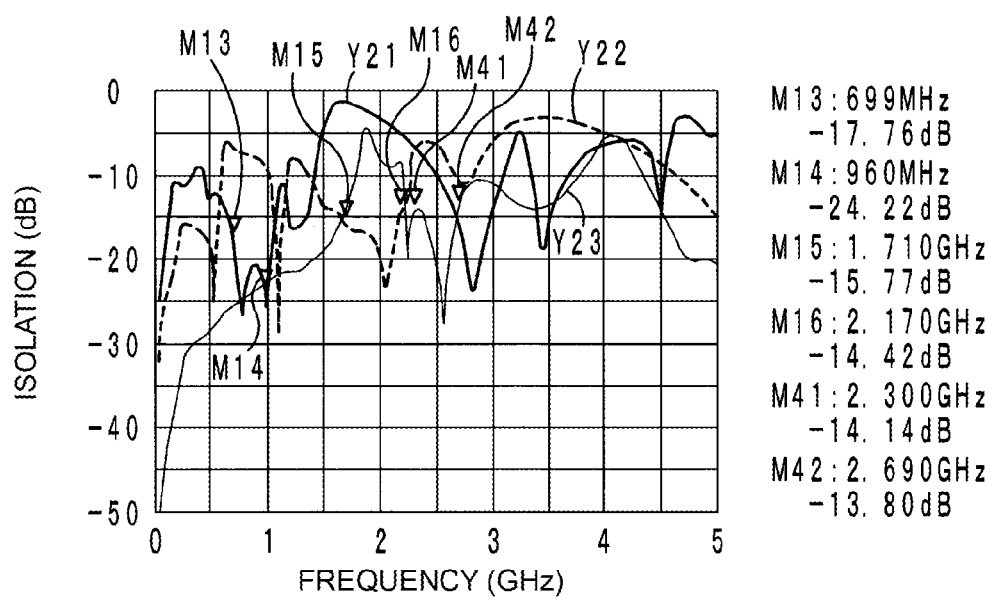
FIG. 15 is a graph depicting isolation characteristics of the nonreversible circuit device according to the fifth embodiment in a direction from the transmission port toward the reception port.

FIG. 15 depicts isolation characteristics in a direction from the transmission port Tx toward the reception port Rx. A curve Y21 represents the isolation characteristics of the first circulator 111, a curve Y22 represents the isolation characteristics of the second circulator 112, and a curve Y23 represents the isolation characteristics of the third circulator 113. An isolation degree in the first circulator 111 is −17.76 dB at 699 MHz and −24.22 dB at 960 MHz. An isolation degree in the second circulator 112 is −15.77 dB at 1.710 GHz and −14.42 dB at 2.170 GHz. An isolation degree in the third circulator 113 is −14.14 dB at 2.300 GHz and −13.80 dB at 2.690 GHz.

Figure 16:
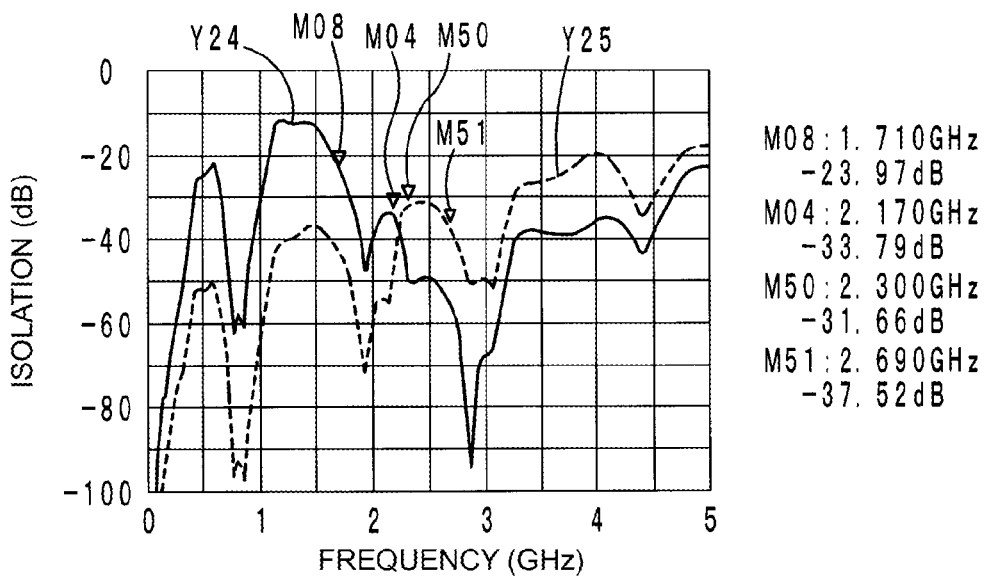
FIG. 16 is a graph depicting isolation characteristics of the nonreversible circuit device according to the fifth embodiment in a direction from a transmission port of a first circulator toward a reception port of a second circulator and toward a reception port of a third circulator.

In FIG. 16, a curve Y24 represents isolation characteristics in a direction from the transmission port Tx of the first circulator 111 toward the reception port Rx of the second circulator 112, and a curve Y25 represents isolation characteristics in a direction from the transmission port Tx of the first circulator 111 toward the reception port Rx of the third circulator 113. The curve Y24 indicates that an isolation degree is −23.97 dB at 1.710 GHz and −33.79 dB at 2.170 GHz. Furthermore, the curve Y25 indicates that an isolation degree is −31.66 dB at 2.300 GHz and −37.52 dB at 2.690 GHz.

Figure 17:
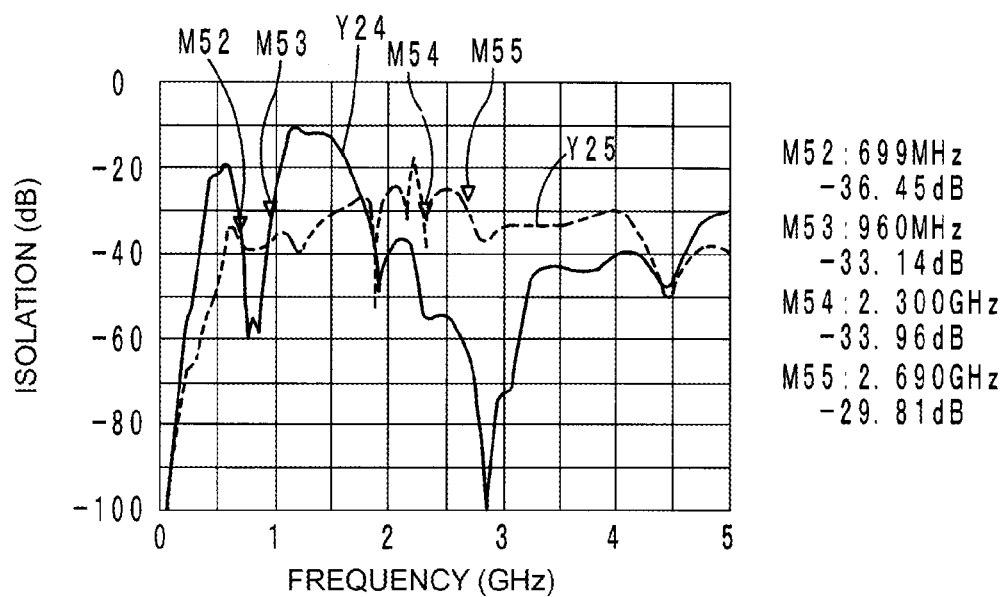
FIG. 17 is a graph depicting isolation characteristics of the nonreversible circuit device according to the fifth embodiment in a direction from a transmission port of the second circulator toward a reception port of the first circulator and toward the reception port of the third circulator.

In FIG. 17, a curve Y24 represents isolation characteristics in a direction from the transmission port Tx of the second circulator 112 toward the reception port Rx of the first circulator 111, and a curve Y25 represents isolation characteristics in a direction from the transmission port Tx of the second circulator 112 toward the reception port Rx of the third circulator 113. The curve Y24 indicates that an isolation degree is −36.45 dB at 699 MHz and −33.14 dB at 960 MHz. Furthermore, the curve Y25 indicates that an isolation degree is −33.96 dB at 2.300 GHz and −29.81 dB at 2.690 GHz.

Figure 18:
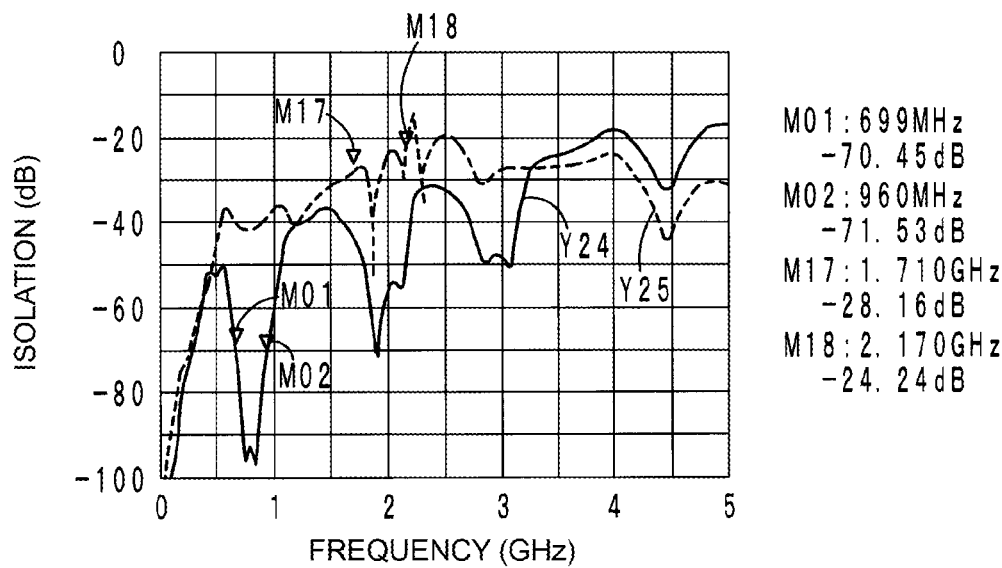
FIG. 18 is a graph depicting isolation characteristics of the nonreversible circuit device according to the fifth embodiment in a direction from a transmission port of the third circulator toward the reception port of the first circulator and toward the reception port of the second circulator.

In FIG. 18, a curve Y24 represents isolation characteristics in a direction from the transmission port Tx of the third circulator 113 to the reception port Rx of the first circulator 111, and a curve Y25 represents isolation characteristics in a direction from the transmission port Tx of the third circulator 113 to the reception port Rx of the second circulator 112. The curve Y24 indicates that an isolation degree is −70.45 dB at 699 MHz and −71.53 dB at 960 MHz. Furthermore, the curve Y25 indicates that an isolation degree is −28.16 dB at 1.710 GHz and −24.24 dB at 2.170 GHz.

Sixth Embodiment

Figure 19:
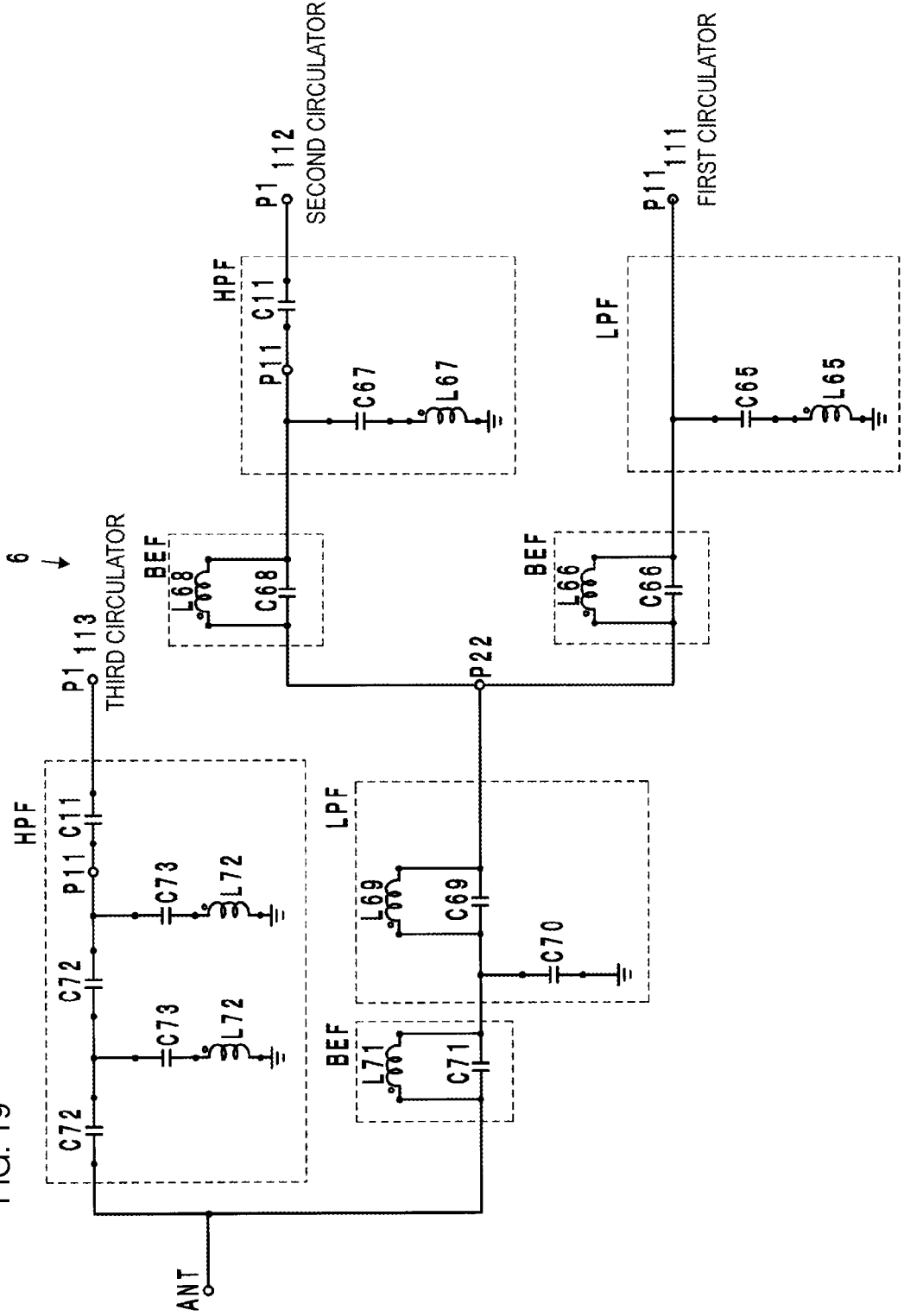
FIG. 19 is an equivalent circuit diagram of a principal part of a nonreversible circuit device according to a sixth embodiment.

See FIG. 19

A nonreversible circuit device 6 according to a sixth embodiment is different from the nonreversible circuit device 2 according to the second embodiment as follows. Specifically, as illustrated in FIG. 19, a band elimination filter BEF is connected to the low pass filter LPF disposed in the first circulator 111, and another band elimination filter BEF is connected to the high pass filter HPF disposed in the second circulator 112. A low pass filter LPF and a still another band elimination filter BEF are connected between a port P22, which is a junction point between the above-mentioned two band elimination filters BEF, and the combined antenna port ANT. Moreover, the third circulator 113 is connected to the combined antenna port ANT through a high pass filter HPF. In this sixth embodiment, the other configuration is similar to that in the second embodiment, and advantageous effects are also basically similar to those in the second embodiment.

In more detail, the low pass filter LPF disposed in the first circulator 111 is constituted as a series resonance circuit made up of a capacitance element C65 and an inductance element L65. The band elimination filter BEF disposed in the first circulator 111 is constituted as a parallel resonance circuit made up of a capacitance element C66 and an inductance element L66. The high pass HPF disposed in the second circulator 112 is constituted by a series resonance circuit made up of a capacitance element C67 and an inductance element L67, and by a capacitance element C11 for matching. The band elimination filter BEF disposed in the second circulator 112 is constituted as a parallel resonance circuit made up of a capacitance element C68 and an inductance element L68.

The low pass filter LPF connected to the junction port P22 between the two band elimination filters BEF is constituted by a resonance circuit made up of a capacitance element C69 and an inductance element L69, which are connected in parallel, and by a capacitance element C70 connected to the ground. The band elimination filter BEF connected to the above low pass filter LPF is constituted as a parallel resonance circuit made up of a capacitance element C71 and an inductance element L71. The high pass filter HPF disposed in the third circulator 113 is constituted by connecting a capacitance element C11 for matching, and two stages of a capacitance element C72 and a series resonance circuit that is made up of a capacitance element C73 and an inductance element L72.

A schematic circuit configuration of the thus-constituted nonreversible circuit device 6 according to the sixth embodiment is as per illustrated in FIG. 23C.

Seventh Embodiment

Figure 20:
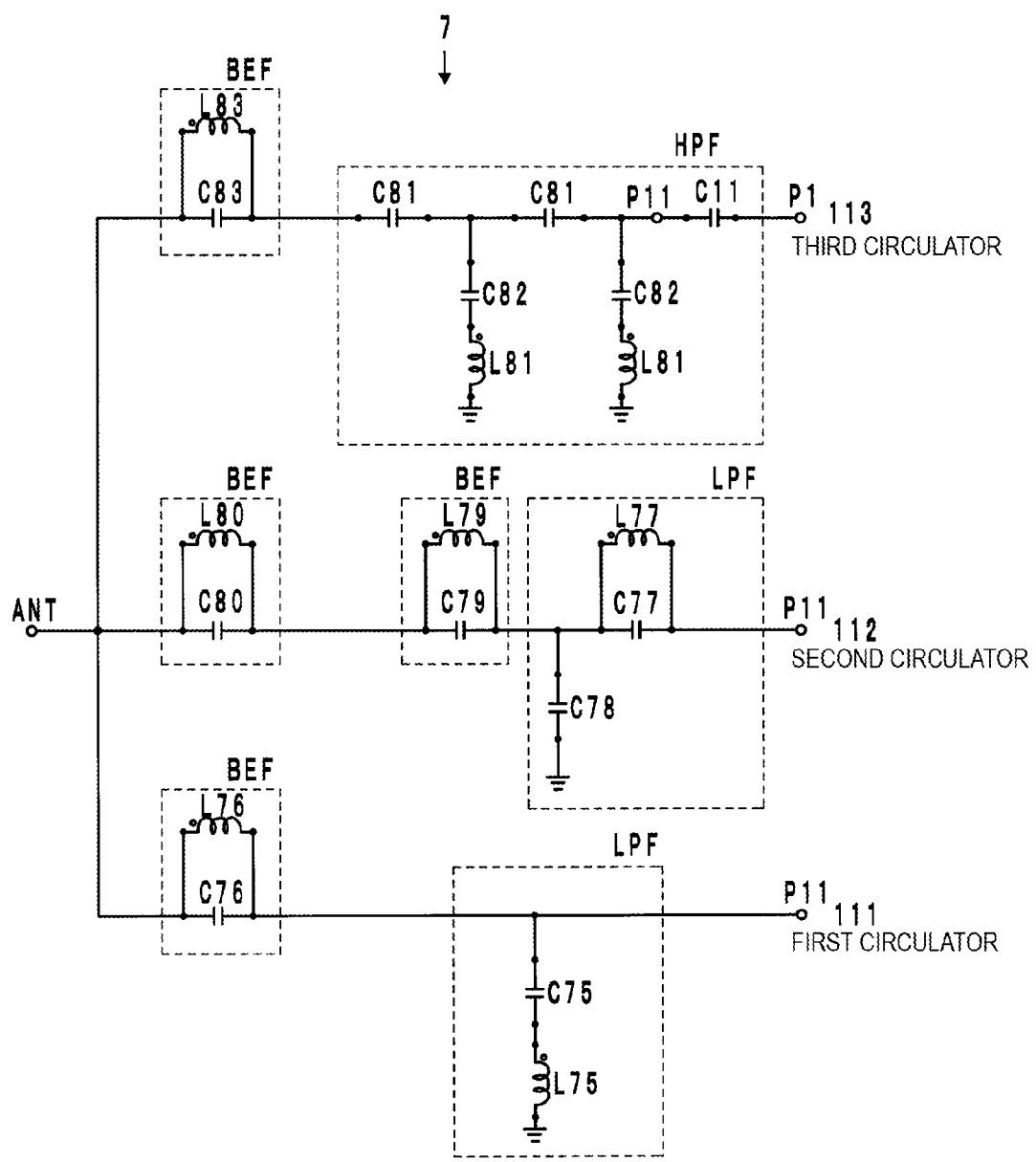
FIG. 20 is an equivalent circuit diagram of a principal part of a nonreversible circuit device according to a seventh embodiment.

See FIG. 20

A nonreversible circuit device 7 according to a seventh embodiment is different from the nonreversible circuit device 2 according to the second embodiment as follows. Specifically, as illustrated in FIG. 20, a band elimination filter BEF is connected to the low pass filter LPF disposed in the first circulator 111, and two band elimination filters BEF are connected to the low pass filter LPF disposed in the second circulator 112. Moreover, a band elimination filter BEF is connected to the high pass filter HPF disposed in the third circulator 113. In this seventh embodiment, the other configuration is similar to that in the second embodiment, and advantageous effects are also basically similar to those in the second embodiment.

In more detail, the low pass filter LPF disposed in the first circulator 111 is constituted as a series resonance circuit made up of a capacitance element C75 and an inductance element L75. The band elimination filter BEF disposed in the first circulator 111 is constituted as a parallel resonance circuit made up of a capacitance element C76 and an inductance element L76. The low pass filter LPF disposed in the second circulator 112 is constituted by a resonance circuit made up of a capacitance element C77 and an inductance element L77, which are connected in parallel, and by a capacitance element C78 connected to the ground. The two band elimination filters BEF disposed in the second circulator 112 are constituted respectively as a parallel resonance circuit made up of a capacitance element C79 and an inductance element L79 and a parallel resonance circuit made up of a capacitance element C80 and an inductance element L80.

The high pass filter HPF disposed in the third circulator 113 is constituted by connecting a capacitance element C11 for matching, and two stages of a capacitance element C81 and a resonance circuit that is made up of a capacitance element C82 and an inductance element L81. The band elimination filter BEF disposed in the third circulator 113 is constituted as a parallel resonance circuit made up of a capacitance element C83 and an inductance element L83.

Figure 24:
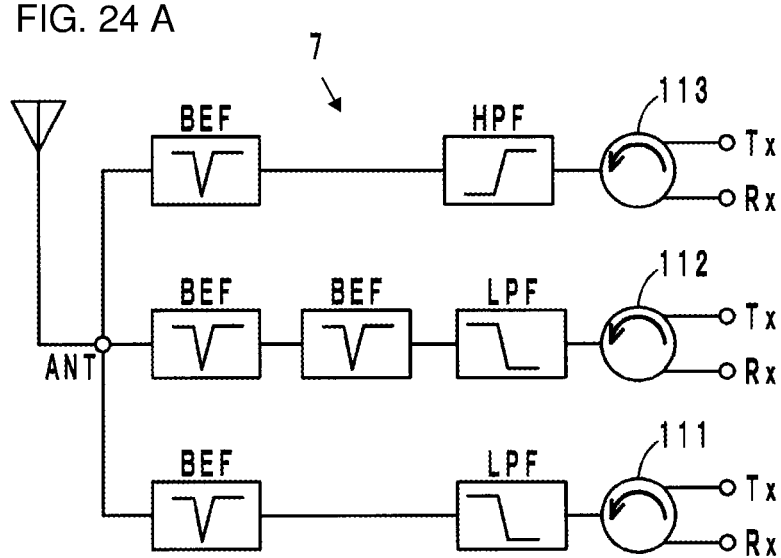
FIG. 24A is a schematic circuit diagram of the seventh embodiment.
FIG. 24B is a schematic circuit diagram of the eighth embodiment.
Figure 24:
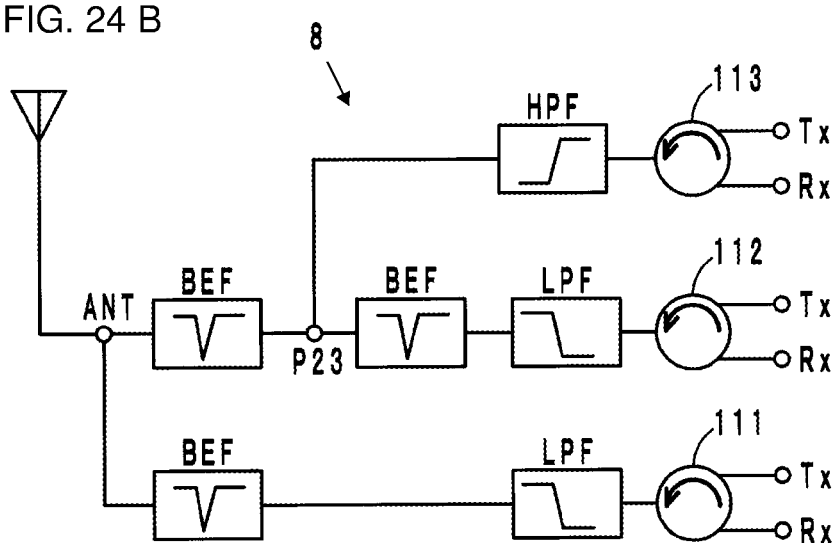

A schematic circuit configuration of the thus-constituted nonreversible circuit device 7 according to the seventh embodiment is as per illustrated in FIG. 24A.

Eighth Embodiment

Figure 21:
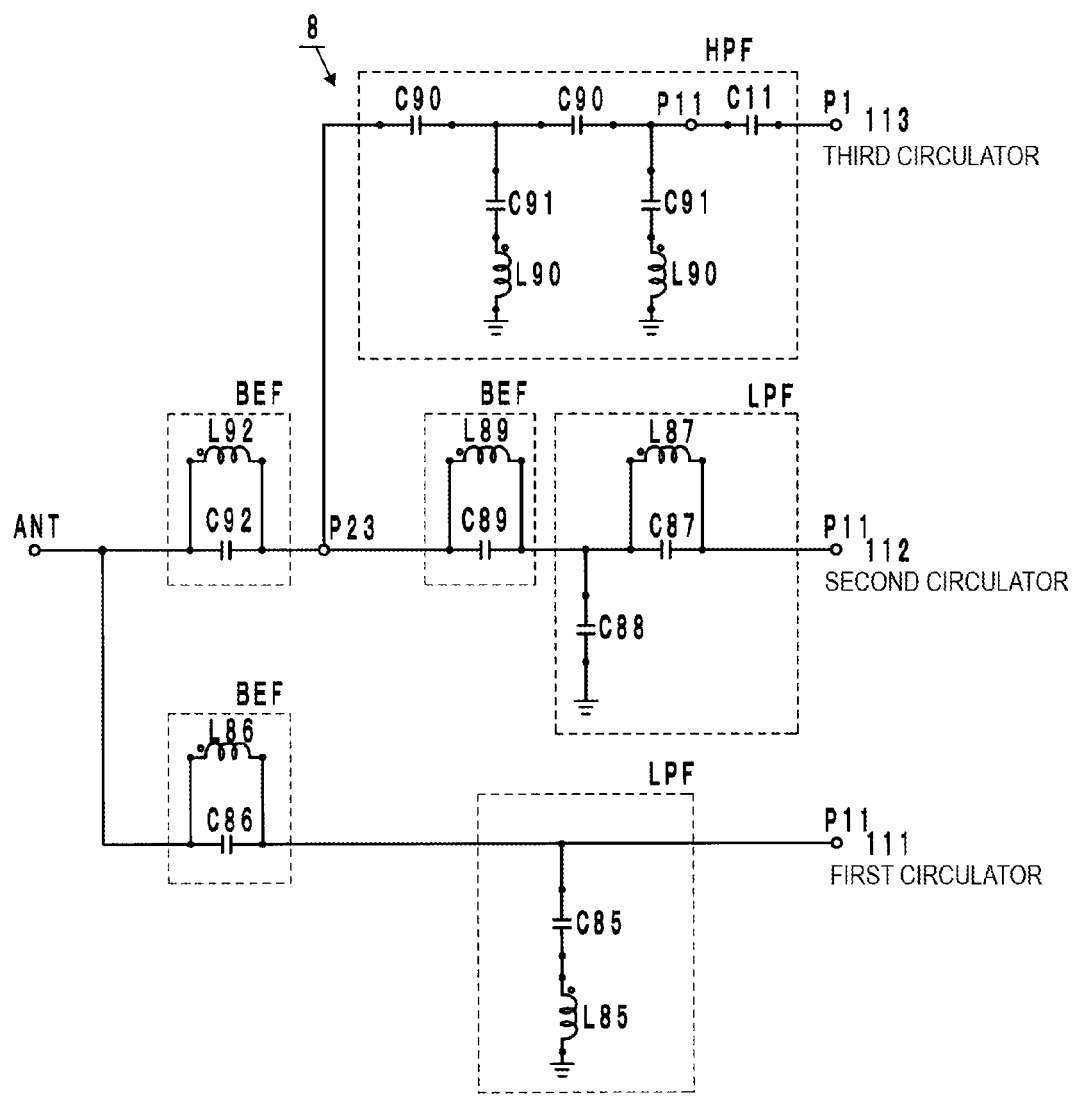
FIG. 21 is an equivalent circuit diagram of a principal part of a nonreversible circuit device according to an eighth embodiment.

See FIG. 21

A nonreversible circuit device 8 according to an eighth embodiment is different from the nonreversible circuit device 2 according to the second embodiment as follows. Specifically, as illustrated in FIG. 21, a band elimination filter BEF is connected to the low pass filter LPF disposed in the first circulator 111, and another band elimination filter BEF is connected to the low pass filter LPF disposed in the second circulator 112. Moreover, still another band elimination filter BEF is connected between a port P23, which is a junction point between the high pass filter HPF in the third circulator 113 and the above-mentioned band elimination filter BEF in the second circulator 112, and the combined antenna port ANT. In this eighth embodiment, the other configuration is similar to that in the second embodiment, and advantageous effects are also basically similar to those in the second embodiment.

In more detail, the low pass filter LPF disposed in the first circulator 111 is constituted as a series resonance circuit made up of a capacitance element C85 and an inductance element L85. The band elimination filter BEF disposed in in the first circulator 111 is constituted as a parallel resonance circuit made up of a capacitance element C86 and an inductance element L86. The low pass filter LPF disposed in the second circulator 112 is constituted by a resonance circuit made up of a capacitance element C87 and an inductance element L87, which are connected in parallel, and by a capacitance element C88 connected to the ground. The band elimination filter BEF disposed in the second circulator 112 is constituted as a parallel resonance circuit made up of a capacitance element C89 and an inductance element L89.

The high pass filter HPF disposed in the third circulator 113 is constituted by connecting a capacitance element C11 for matching, and two stages of a capacitance element C90 and a resonance circuit that is made up of a capacitance element C91 and an inductance element L90. The band elimination filter BEF disposed between the port P23, which is a junction point between the high pass filter HPF disposed in the third circulator 113 and the band elimination filter BEF disposed in the second circulator 112, and the combined antenna port ANT is constituted as a parallel resonance circuit made up of a capacitance element C92 and an inductance element L92.

A schematic circuit configuration of the thus-constituted nonreversible circuit device 8 according to the eighth embodiment is as per illustrated in FIG. 24B.

Ninth Embodiment

Figure 25:
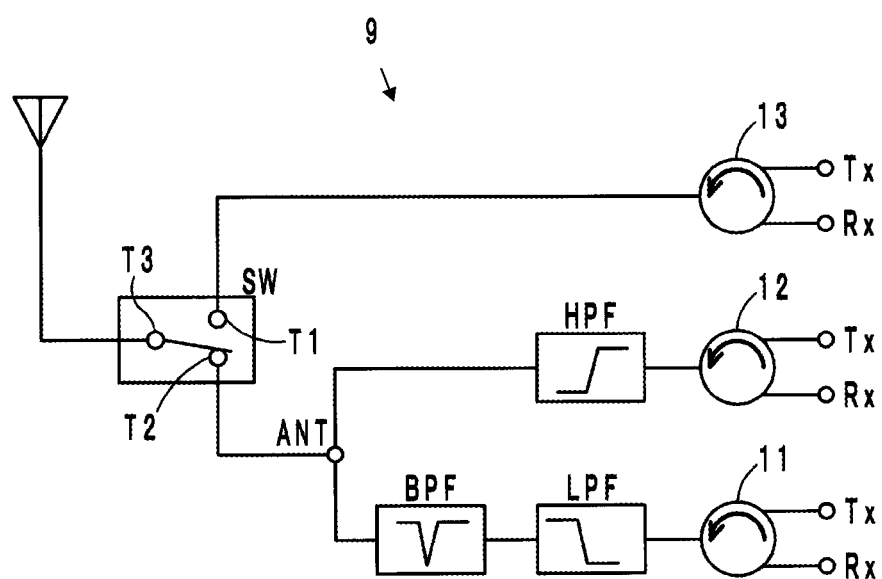
FIG. 25 is a schematic circuit diagram of a ninth embodiment.

See FIG. 25

A nonreversible circuit device 9 according to a ninth embodiment is constituted, as illustrated in FIG. 25, by adding a third circulator 13 and a switch SW to the nonreversible circuit device (see FIG. 23A) according to the fourth embodiment. The third circulator 13 is connected to one separate terminal T1 of the switch SW, and the combined antenna port ANT of both the first and second circulators 11 and 12 is connected to a different separate terminal T2 of the switch SW. An antenna is connected to a common terminal T3 of the switch SW. By switching the common terminal T3 to be connected to the separate terminal T1, the third circulator 13 is connected to the antenna. On the other hand, by switching the common terminal T3 to be connected to the separate terminal T2, the first and second circulators 11 and 12 are connected to the antenna.

Other Embodiments

The nonreversible circuit device according to the present disclosure is not limited to the above-described embodiments, and it can be variously modified within the scope not departing from the gist of the present disclosure.

In particular, the structures, the shapes, and so on of the ferrite and the central conductors are optionally selectable. It is also optional, for example, to connect an inductance element and a capacitance element in relations adapted for realizing a wider band, and to add a capacitance element for establishing impedance matching.

INDUSTRIAL APPLICABILITY

As described above, the present disclosure is useful in a nonreversible circuit device. In particular, the present disclosure is superior in providing a nonreversible circuit device which can operate in a plurality of frequency bands, can reduce the number of components and the cost of a transmission-reception circuit, can suppress influences of load variations at the antenna side upon the transmission-reception circuit, and can stabilize the operation of the transmission-reception circuit.

REFERENCE SIGNS LIST 1 to 9 . . . NONREVERSIBLE CIRCUIT DEVICE
11, 12, 13, 111, 112, 113 . . . CIRCULATOR
20 . . . FERRITE
21 . . . FIRST CENTRAL CONDUCTOR
22 . . . SECOND CENTRAL CONDUCTOR
23 . . . THIRD CENTRAL CONDUCTOR
25 . . . PERMANENT MAGNET
P11 (ANT) . . . ANTENNA PORT
P12 (Rx) . . . RECEPTION PORT
P13 (Tx) . . . TRANSMISSION PORT
ANT . . . COMBINED ANTENNA PORT
C . . . CAPACITANCE ELEMENT
L . . . INDUCTANCE ELEMENT
LPF . . . LOW PASS FILTER
HPF . . . HIGH PASS FILTER
BPF . . . BAND PASS FILTER
BEF . . . BAND ELIMINATION FILTER

The invention claimed is:

1. A nonreversible circuit device including first and second circulators of high pass type, each circulator including a first central conductor, a second central conductor, and a third central conductor arranged on a microwave magnetic body, to which a DC magnetic field is applied from a permanent magnet, in a relation intersecting each other in a mutually insulated state, and capacitance elements connected respectively in series between one end of the first central conductor and an antenna port, between one end of the second central conductor and a reception port, and between one end of the third central conductor and a transmission port,
wherein a pass frequency band of the first circulator is lower than a pass frequency band of the second circulator,
the respective antenna ports of the first and second circulators are electrically connected to provide one combined antenna port, and
a low pass filter is inserted between the combined antenna port and the antenna port of the first circulator.

2. The nonreversible circuit device according to claim 1, wherein a high pass filter is inserted between the combined antenna port and the antenna port of the second circulator.

3. The nonreversible circuit device according to claim 2, wherein respective other ends of the first central conductor, the second central conductor, and the third central conductor are connected to one another and are connected to a ground.

4. The nonreversible circuit device according to claim 3, wherein the respective other ends of the first central conductor, the second central conductor, and the third central conductor are connected to a ground through an inductance element and a capacitance element, which are connected in series.

5. The nonreversible circuit device according to claim 1, wherein respective other ends of the first central conductor, the second central conductor, and the third central conductor are connected to one another and are connected to a ground.

6. The nonreversible circuit device according to claim 5, wherein the respective other ends of the first central conductor, the second central conductor, and the third central conductor are connected to a ground through an inductance element and a capacitance element, which are connected in series.

7. A nonreversible circuit device including first, second and third circulators of high pass type, each circulator including a first central conductor, a second central conductor, and a third central conductor arranged on a microwave magnetic body, to which a DC magnetic field is applied from a permanent magnet, in a relation intersecting each other in a mutually insulated state, and capacitance elements connected respectively in series between one end of the first central conductor and an antenna port, between one end of the second central conductor and a reception port, and between one end of the third central conductor and a transmission port,
wherein a pass frequency band of the first circulator is lower than a pass frequency band of the second circulator, and the pass frequency band of the second circulator is lower than a pass frequency band of the third circulator, the respective antenna ports of the first, second and third circulators are electrically connected to provide one combined antenna port, and a low pass filter is inserted between the combined antenna port and the antenna port of the first circulator, a band pass filter or a low pass filter is inserted between the combined antenna port and the antenna port of the second circulator, and a high pass filter is inserted between the combined antenna port and the antenna port of the third circulator.

8. The nonreversible circuit device according to claim 7, wherein respective other ends of the first central conductor, the second central conductor, and the third central conductor are connected to one another and are connected to a ground.

9. The nonreversible circuit device according to claim 8, wherein the respective other ends of the first central conductor, the second central conductor, and the third central conductor are connected to a ground through an inductance element and a capacitance element, which are connected in series.

10. A nonreversible circuit device including first to N-th circulators of high pass type, N being an integer equal to or more than 2, each circulator including a first central conductor, a second central conductor, and a third central conductor arranged on a microwave magnetic body, to which a DC magnetic field is applied from a permanent magnet, in a relation intersecting each other in a mutually insulated state, and capacitance elements connected respectively in series between one end of the first central conductor and an antenna port, between one end of the second central conductor and a reception port, and between one end of the third central conductor and a transmission port, wherein a pass frequency band of the (N−1)-th circulator is lower than a pass frequency band of the N-th circulator, the respective antenna ports of the first to N-th circulators are electrically connected to provide one combined antenna port, and a low pass filter is inserted between the combined antenna port and the antenna port of the first circulator, a band pass filter or a low pass filter is inserted between the combined antenna port and the antenna port of each of the second to (N−1)-th circulators, and a high pass filter is inserted between the combined antenna port and the antenna port of the N-th circulator.

11. The nonreversible circuit device according to claim 10, wherein respective other ends of the first central conductor, the second central conductor, and the third central conductor are connected to one another and are connected to a ground.

12. The nonreversible circuit device according to claim 11, wherein the respective other ends of the first central conductor, the second central conductor, and the third central conductor are connected to a ground through an inductance element and a capacitance element, which are connected in series.

* * * * *